US011026019B2

(12) United States Patent
Salehin et al.

(10) Patent No.: US 11,026,019 B2
(45) Date of Patent: Jun. 1, 2021

(54) AMBISONIC SIGNAL NOISE REDUCTION FOR MICROPHONE ARRAYS

(71) Applicant: QUALCOMM Incorporated, San Diego, CA (US)

(72) Inventors: S M Akramus Salehin, San Diego, CA (US); Dipanjan Sen, Dublin, CA (US)

(73) Assignee: Qualcomm Incorporated, San Diego, CA (US)

( * ) Notice: Subject to any disclaimer, the term of this patent is extended or adjusted under 35 U.S.C. 154(b) by 261 days.

(21) Appl. No.: 16/352,272

(22) Filed: Mar. 13, 2019

(65) Prior Publication Data

US 2020/0107118 A1 Apr. 2, 2020

Related U.S. Application Data

(60) Provisional application No. 62/737,711, filed on Sep. 27, 2018.

(51) Int. Cl.

| | |
|---|---|
| ***G10L 19/16*** | (2013.01) |
| ***H04R 1/22*** | (2006.01) |
| ***H04S 7/00*** | (2006.01) |
| ***H03G 3/24*** | (2006.01) |
| ***H04R 3/00*** | (2006.01) |
| ***H04R 1/40*** | (2006.01) |

(52) U.S. Cl.
CPC ............. *H04R 3/005* (2013.01); *H04R 1/406* (2013.01); *H04S 7/30* (2013.01); *H04R 2499/11* (2013.01); *H04S 2420/11* (2013.01)

(58) Field of Classification Search
CPC .. H04R 1/22; H04R 2430/03; H04R 2430/20; H04R 2203/12; H04S 7/30; H04S 7/302; H04S 2420/11; H03G 3/24; G10L 19/167
USPC .................................................... 381/26, 310
See application file for complete search history.

(56) References Cited

U.S. PATENT DOCUMENTS

| | | | | |
|---|---|---|---|---|
| 9,865,274 | B1 * | 1/2018 | Vicinus | G10L 19/20 |
| 2019/0069083 | A1 | 2/2019 | Salehin et al. | |
| 2020/0005760 | A1 * | 1/2020 | Tao | B60R 11/02 |

* cited by examiner

*Primary Examiner* — Paul Kim
*Assistant Examiner* — Ubachukwu A Odunukwe
(74) *Attorney, Agent, or Firm* — Moore IP

(57) ABSTRACT

A device to apply noise reduction to ambisonic signals includes a memory configured to store noise data corresponding to microphones in a microphone array. A processor is configured to perform signal processing operations on signals captured by microphones in the microphone array to generate multiple sets of ambisonic signals including a first set corresponding to a first particular ambisonic order and a second set corresponding to a second particular ambisonic order. The processor is configured to perform a first noise reduction operation that includes applying a first gain factor to each ambisonic signal in the first set and to perform a second noise reduction operation that includes applying a second gain factor to each ambisonic signal in the second set. The first gain factor and the second gain factor are based on the noise data, and the second gain factor is distinct from the first gain factor.

26 Claims, 13 Drawing Sheets

AMBISONIC SIGNAL NOISE REDUCTION FOR MICROPHONE ARRAYS

I. CROSS-REFERENCE TO RELATED APPLICATIONS

The present application claims priority from U.S. Provisional Patent Application No. 62/737,711, filed Sep. 27, 2018, entitled "AMBISONIC SIGNAL NOISE REDUCTION FOR MICROPHONE ARRAYS," which is incorporated by reference in its entirety.

II. FIELD

The present disclosure is generally related to microphones.

III. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

A higher-order ambisonics (HOA) signal (often represented by a plurality of spherical harmonic coefficients (SHC) or other hierarchical elements) is a three-dimensional representation of a soundfield. The HOA signal, or SHC representation of the HOA signal, may represent the soundfield in a manner that is independent of local speaker geometry used to playback a multi-channel audio signal rendered from the HOA signal. The HOA signal may also facilitate backwards compatibility as the HOA signal may be rendered to multi-channel formats, such as a 5.1 audio channel format or a 7.1 audio channel format.

Microphones used to capture audio for direct ambisonic conversion introduce "hiss" noise that may be audible during playback. Applying noise reduction, such as Wiener filtering and spectral subtraction, at the microphones can impair audio quality and introduce errors in direction information of audio signals. Applying Wiener filtering and spectral subtraction independently at loudspeakers during playback also introduces audio quality artefacts when loudspeaker contributions are added at the listener's position.

IV. SUMMARY

According to a particular implementation of the techniques disclosed herein, a device is configured to apply noise reduction to ambisonic signals. The device includes a memory configured to store noise data corresponding to microphones in a microphone array. The device also includes a processor configured to perform signal processing operations on signals captured by microphones in the microphone array to generate multiple sets of ambisonic signals. The multiple sets of ambisonic signals include a first set corresponding to a first particular ambisonic order and a second set corresponding to a second particular ambisonic order. The processor is also configured to perform a first noise reduction operation that includes applying a first gain factor to each ambisonic signal in the first set. The first gain factor is based on the noise data. The processor is also configured to perform a second noise reduction operation that includes applying a second gain factor to each ambisonic signal in the second set. The second gain factor is based on the noise data and is distinct from the first gain factor.

According to another particular implementation of the techniques disclosed herein, a method of reducing noise in ambisonic signals includes performing signal processing operations on signals captured by microphones in a microphone array to generate ambisonic signals. The ambisonic signals include multiple sets of ambisonic signals including a first set corresponding to a first particular ambisonic order and a second set corresponding to a second particular ambisonic order. The method includes performing a first noise reduction operation that includes applying a first gain factor to each ambisonic signal in the first set. The first gain factor is based on noise data corresponding to the microphones. The method includes performing a second noise reduction operation that includes applying a second gain factor to each ambisonic signal in the second set. The second gain factor is based on the noise data and is distinct from the first gain factor.

According to another particular implementation of the techniques disclosed herein, a non-transitory computer-readable medium includes instructions that, when executed by a processor, cause the processor to perform operations to cause the processor to perform operations to apply noise reduction to ambisonic signals. The operations include performing signal processing operations on signals captured by microphones in a microphone array to generate ambisonic signals. The ambisonic signals include multiple sets of ambisonic signals including a first set corresponding to a first particular ambisonic order and a second set corresponding to a second particular ambisonic order. The operations include performing a first noise reduction operation that includes applying a first gain factor to each ambisonic signal in the first set. The first gain factor is based on noise data corresponding to the microphones. The operations also include performing a second noise reduction operation that includes applying a second gain factor to each ambisonic signal in the second set. The second gain factor is based on the noise data and is distinct from the first gain factor.

According to another particular implementation of the techniques disclosed herein, an apparatus to apply noise reduction to ambisonic signals includes means for storing noise data corresponding to microphones in a microphone array. The apparatus includes means for performing signal processing operations on signals captured by microphones in the microphone array to generate multiple sets of ambisonic signals. The multiple sets of ambisonic signals include a first set corresponding to a first particular ambisonic order and a second set corresponding to a second particular ambisonic order. The apparatus includes means for performing a first noise reduction operation that includes applying a first gain factor to each ambisonic signal in the first set. The first gain factor is based on the noise data. The apparatus also includes means for performing a second noise reduction operation that includes applying a second gain factor to each ambisonic signal in the second set. The second gain factor is based on the noise data and is distinct from the first gain factor.

Other implementations, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1A:
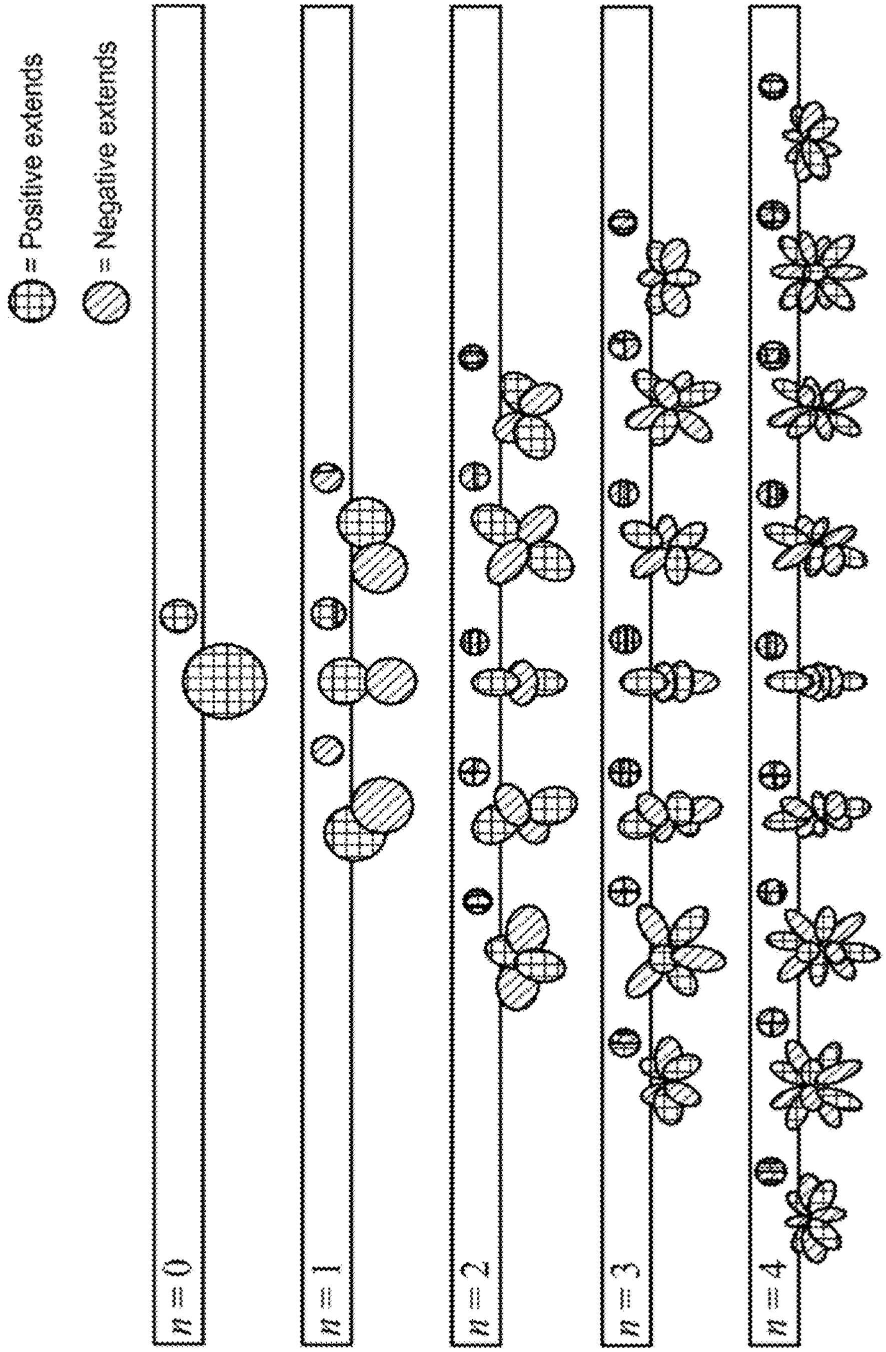
FIG. 1A is a diagram illustrating spherical harmonic basis functions of various orders and sub-orders.

Conventional techniques for reducing noise introduced by microphone arrays that capture audio for direct ambisonic conversion can generate undesirable effects. For example, applying conventional noise reduction at the microphones can impair audio quality and introduce errors in direction information of audio signals, while applying conventional noise reduction independently at loudspeakers during playback also introduces audio quality artefacts when loudspeaker contributions are added at the listener's position.

The present disclosure describes noise reduction devices and techniques that reduce or eliminate the impaired audio quality and errors in direction information associated with conventional techniques. As described herein, improved noise reduction can be performed that includes, for each ambisonic order, determining microphone noise for the microphones contributing to signals of that ambisonic order, and using the microphone noise to generate a gain factor that is applied to the signals of that ambisonic order. By scaling signals corresponding to each of the ambisonic orders independently of the other ambisonic orders, noise is reduced and the direction information loss associated with conventional noise reduction techniques is also reduced or eliminated.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. It may be further understood that the terms "comprise," "comprises," and "comprising" may be used interchangeably with "include," "includes," or "including." Additionally, it will be understood that the term "wherein" may be used interchangeably with "where." As used herein, "exemplary" may indicate an example, an implementation, and/or an aspect, and should not be construed as limiting or as indicating a preference or a preferred implementation. As used herein, an ordinal term (e.g., "first," " "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

As used herein, "coupled" may include communicatively coupled, electrically coupled, magnetically coupled, physically coupled, optically coupled, and combinations thereof. Two devices (or components) may be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled may be included in the same device or in different devices and may be connected via electronics, one or more connectors, or inductive coupling, as illustrative, non-limiting examples. In some implementations, two devices (or components) that are communicatively coupled, such as in electrical communication, may send and receive electrical signals (digital signals or analog signals) directly or indirectly, such as via one or more wires, buses, networks, etc.

In the present disclosure, terms such as "determining", "calculating", "estimating", "shifting", "adjusting", etc. may be used to describe how one or more operations are performed. It should be noted that such terms are not to be construed as limiting and other techniques may be utilized to perform similar operations. Additionally, as referred to herein, "generating", "calculating", "estimating", "using", "selecting", "accessing", and "determining" may be used interchangeably. For example, "generating", "calculating", "estimating", or "determining" a parameter (or a signal) may refer to actively generating, estimating, calculating, or determining the parameter (or the signal) or may refer to using, selecting, or accessing the parameter (or signal) that is already generated, such as by another component or device.

In general, techniques are described for coding of higher-order ambisonics audio data. Higher-order ambisonics audio data may include at least one higher-order ambisonic (HOA) coefficient corresponding to a spherical harmonic basis function having an order greater than one.

The evolution of surround sound has made available many audio output formats for entertainment. Examples of such consumer surround sound formats are mostly ‘channel’ based in that they implicitly specify feeds to loudspeakers in certain geometrical coordinates. The consumer surround sound formats include the popular 5.1 format (which includes the following six channels: front left (FL), front right (FR), center or front center, back left or surround left, back right or surround right, and low frequency effects (LFE)), the growing 7.1 format, and various formats that includes height speakers such as the 7.1.4 format and the 22.2 format (e.g., for use with the Ultra High Definition Television standard). Non-consumer formats can span any number of speakers (in symmetric and non-symmetric geometries) often termed ‘surround arrays’. One example of such a sound array includes 32 loudspeakers positioned at coordinates on the corners of a truncated icosahedron.

The input to a future Moving Picture Experts Group (MPEG) encoder is optionally one of three possible formats: (i) traditional channel-based audio (as discussed above), which is meant to be played through loudspeakers at pre-specified positions; (ii) object-based audio, which involves discrete pulse-code-modulation (PCM) data for single audio objects with associated metadata containing their location coordinates (amongst other information); or (iii) scene-based audio, which involves representing the soundfield using coefficients of spherical harmonic basis functions (also called “spherical harmonic coefficients” or SHC, “Higher-order Ambisonics” or HOA, and “HOA coefficients”). The future MPEG encoder may be described in more detail in a document entitled “Call for Proposals for 3D Audio,” by the International Organization for Standardization/International Electrotechnical Commission (ISO)/(IEC) JTC1/SC29/WG11/N13411, released January 2013 in Geneva, Switzerland, and available at http://mpeg.chiariglione.org/sites/default/files/files/standards/parts/docs/w13411.zip.

There are various ‘surround-sound’ channel-based formats currently available. The formats range, for example, from the 5.1 home theatre system (which has been the most successful in terms of making inroads into living rooms beyond stereo) to the 22.2 system developed by NHK (Nippon Hoso Kyokai or Japan Broadcasting Corporation). Content creators (e.g., Hollywood studios) would like to produce a soundtrack for a movie once, and not spend effort to remix it for each speaker configuration. Recently, Standards Developing Organizations have been considering ways in which to provide an encoding into a standardized bitstream and a subsequent decoding that is adaptable and agnostic to the speaker geometry (and number) and acoustic conditions at the location of the playback (involving a renderer).

To provide such flexibility for content creators, a hierarchical set of elements may be used to represent a soundfield. The hierarchical set of elements may refer to a set of elements in which the elements are ordered such that a basic set of lower-ordered elements provides a full representation of the modeled soundfield. As the set is extended to include higher-order elements, the representation becomes more detailed, increasing resolution.

One example of a hierarchical set of elements is a set of spherical harmonic coefficients (SHC). The following expression demonstrates a description or representation of a soundfield using SHC:

$$p_i(t, r_r, \theta_r, \varphi_r) = \sum_{\omega=0}^{\infty}\left[4\pi\sum_{n=0}^{\infty} j_n(kr_r)\sum_{m=-n}^{n} A_n^m(k)Y_n^m(\theta_r, \varphi_r)\right]e^{j\omega t},$$

The expression shows that the pressure $p_i$ at any point $\{r_r, \theta_r, \varphi_r\}$ of the soundfield, at time t, can be represented uniquely by the SHC, $A_n^m(k)$. Here, $$k = \frac{\omega}{c},$$

c is the speed of sound (~343 m/s), $\{r_r, \theta_r, \varphi_r\}$ is a point of reference (or observation point), $j_n(\bullet)$ is the spherical Bessel function of order n, and $Y_n^m(\theta_r, \varphi_r)$ are the spherical harmonic basis functions of order n and suborder m. It can be recognized that the term in square brackets is a frequency-domain representation of the signal (i.e., $S(\omega, r_r, \theta_r, \varphi_r)$) which can be approximated by various time-frequency transformations, such as the discrete Fourier transform (DFT), the discrete cosine transform (DCT), or a wavelet transform. Other examples of hierarchical sets include sets of wavelet transform coefficients and other sets of coefficients of multiresolution basis functions.

FIG. 1A is a diagram illustrating spherical harmonic basis functions from the zero order (n=0) to the fourth order (n=4). As can be seen, for each order, there is an expansion of suborders m which are shown but not explicitly noted in the example of FIG. 1A for ease of illustration purposes. A number of spherical harmonic basis functions for a particular order may be determined as: # basis functions=(n+1)^2. For example, a tenth order (n=10) would correspond to 122 spherical harmonic basis functions (e.g., (10+1)^2).

The SHC $A_n^m(k)$ can either be physically acquired (e.g., recorded) by various microphone array configurations or, alternatively, they can be derived from channel-based or object-based descriptions of the soundfield. The SHC represent scene-based audio, where the SHC may be input to an audio encoder to obtain encoded SHC that may promote more efficient transmission or storage. For example, a fourth-order representation involving $(1+4)^2$ (25, and hence fourth order) coefficients may be used.

As noted above, the SHC may be derived from a microphone recording using a microphone array. Various examples of how SHC may be derived from microphone arrays are described in Poletti, M., “Three-Dimensional Surround Sound Systems Based on Spherical Harmonics,” J. Audio Eng. Soc., Vol. 53, No. 11, 2005 November, pp. 1004-1025.

To illustrate how the SHCs may be derived from an object-based description, consider the following equation. The coefficients $A_n^m(k)$ for the soundfield corresponding to an individual audio object may be expressed as:

$$A_n^m(k)=g(\omega)(-4\pi ik)h_n^{(2)}(kr_s)Y_n^{m*}(\theta_s,\varphi_s),$$

where i is $\sqrt{-1}$, $h_n^{(2)}(\bullet)$ is the spherical Hankel function (of the second kind) of order n, and $\{r_s, \theta_s, \varphi_s\}$ is the location of the object. Knowing the object source energy $g(\omega)$ as a function of frequency (e.g., using time-frequency analysis techniques, such as performing a fast Fourier transform on the PCM stream) enables conversion of each PCM object and the corresponding location into the SHC $A_n^m(k)$. Further, it can be shown (since the above is a linear and orthogonal decomposition) that the $A_n^m(k)$ coefficients for each object are additive. In this manner, a multitude of PCM objects can be represented by the $A_n^m(k)$ coefficients (e.g., as a sum of the coefficient vectors for the individual objects). Essentially, the coefficients contain information about the soundfield (the pressure as a function of 3D coordinates), and the above represents the transformation from individual objects to a representation of the overall soundfield, in the vicinity of the observation point $\{r_r, \theta_r, \varphi_r\}$.

Figure 1B:
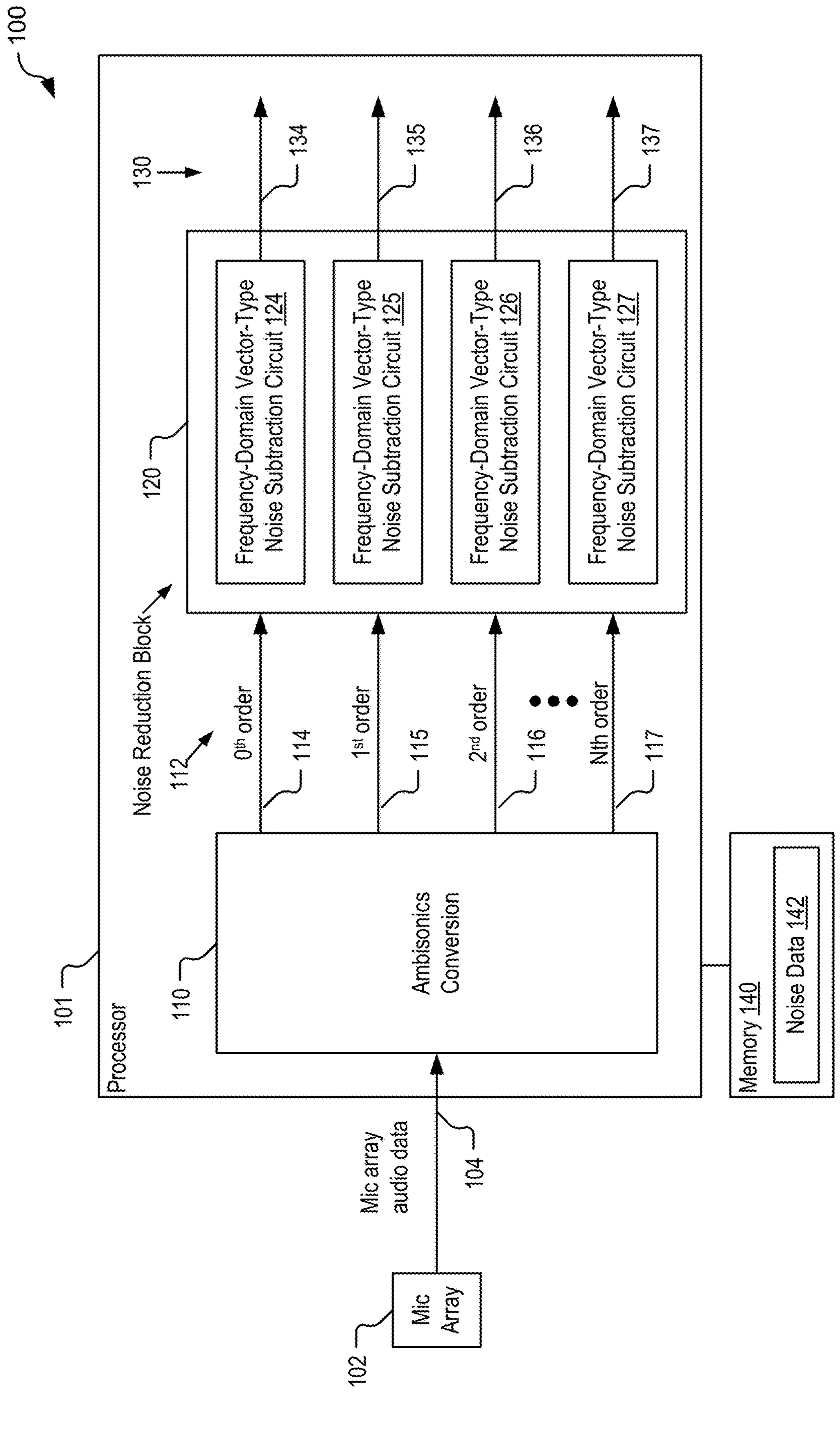
FIG. 1B is a block diagram illustrating a first implementation of components of an ambisonic noise reduction system.

Referring to FIG. 1B, a system 100 for generating ambisonic signals using a microphone array and performing noise reduction to the ambisonic signals is shown. The system 100 may be integrated into multiple devices. As non-limiting examples, the system 100 may be integrated into a robot, a mobile phone, a head-mounted display, a virtual reality headset, or an optical wearable (e.g., glasses).

The system 100 includes a microphone array 102 configured to provide audio data 104 to a processor 101 that includes an ambisonics conversion circuit 110. Ambisonic signals 112 corresponding to the audio data 104 are output by the ambisonics conversion circuit 110 and provided to a noise reduction block 120 in the processor 101. Noise reduced ambisonics signals 130 are output by the noise reduction block 120 and correspond to noise-reduced versions of the ambisonic signals 112.

The microphone array 102 includes multiple microphones configured to capture the audio data 104. For example, the microphone array 102 may have a spherical microphone array configuration, such as an Eigenmike or Zylia spherical array. In other examples, the microphone array 102 has another configuration, such as a linear array configuration, a tetrahedral configuration, or any other regular or non-regular configuration. The microphone array 102 may include any number of microphones, such as four microphones, eight microphones, or 32 microphones, as illustrative, non-limiting examples.

The ambisonic signals 112 include a first set 114 corresponding to a zero-order ambisonic signal (e.g., a W signal), a second set 115 corresponding to first order ambisonic signals (e.g., X, Y, and Z signals), a third set 116 corresponding to second order ambisonic signals, and one or more additional sets including a set 117 corresponding to N-th order ambisonic signals (where N is an integer greater than 2). The noise reduced ambisonics signals 130 include a first set 134 corresponding to a noise-reduced version of the first set 114 (e.g., a W signal), a second set 135 corresponding to a noise-reduced version of the second set 115, a third set 136 corresponding to a noise-reduced version of the third set 116, and one or more additional sets including a set 137 corresponding to a noise-reduced version of the set 117.

The noise reduction block 120 includes a frequency-domain vector-type noise subtraction circuit 124 configured to process the first set 114 to generate the noise-reduced first set 134, a frequency-domain vector-type noise subtraction circuit 125 configured to process the second set 115 to generate the noise-reduced second set 135, a frequency-domain vector-type noise subtraction circuit 126 configured to process the third set 116 to generate the noise-reduced third set 136, and one or more frequency-domain vector-type noise subtraction circuits including a frequency-domain vector-type noise subtraction circuit 127 configured to process the set 117 to generate the noise-reduced set 137.

The noise reduction block 120 is configured to process each order of the ambisonic signals 112 independently of the other orders of the ambisonic signals 112. Noise data 142 is stored in a memory 140 that is coupled to the processor 101. As explained in further detail with reference to FIGS. 2-3, the noise data 142 includes noise measurement data, corresponding to each of the ambisonic orders, that is used to perform vector-type noise subtraction to reduce noise in the ambisonic signals. Higher orders of the ambisonic signals 112 generally have higher noise than lower orders of the ambisonic signals 112, and thus may be subjected to greater noise suppression in the noise reduction block 120. Also, directional information in each order of the ambisonic signals 112 is independent of the directional information in the other orders of the ambisonics signals 112, with higher orders having higher resolution directional information as compared to lower orders.

To illustrate, in an implementation in which N=4, the frequency-domain vector-type noise subtraction circuit 124 performs noise reduction on ambisonic signals of order 0, the frequency-domain vector-type noise subtraction circuit 125 performs noise reduction on ambisonic signals of order 1, the frequency-domain vector-type noise subtraction circuit 126 performs noise reduction on ambisonic signals of order 2, another frequency-domain vector-type noise subtraction circuit (not shown) performs noise reduction on ambisonic signals of order 3, and the frequency-domain vector-type noise subtraction circuit 127 performs noise reduction on ambisonic signals of order 4. In such an implementation with N=4, each of the five active frequency-domain vector-type noise subtraction circuits operates independently of, and in parallel with, each other to generate the noise-reduced ambisonics signals 130. In another implementation in which N=8, the noise reduction block 120 includes nine active frequency-domain vector-type noise subtraction circuits, and each of the nine active frequency-domain vector-type noise subtraction circuits operates independently of, and in parallel with, each other to generate the noise-reduced ambisonics signals 130. Although examples are described with N=4 and N=8, it should be understood that N may be any integer greater than 1.

Figure 3:
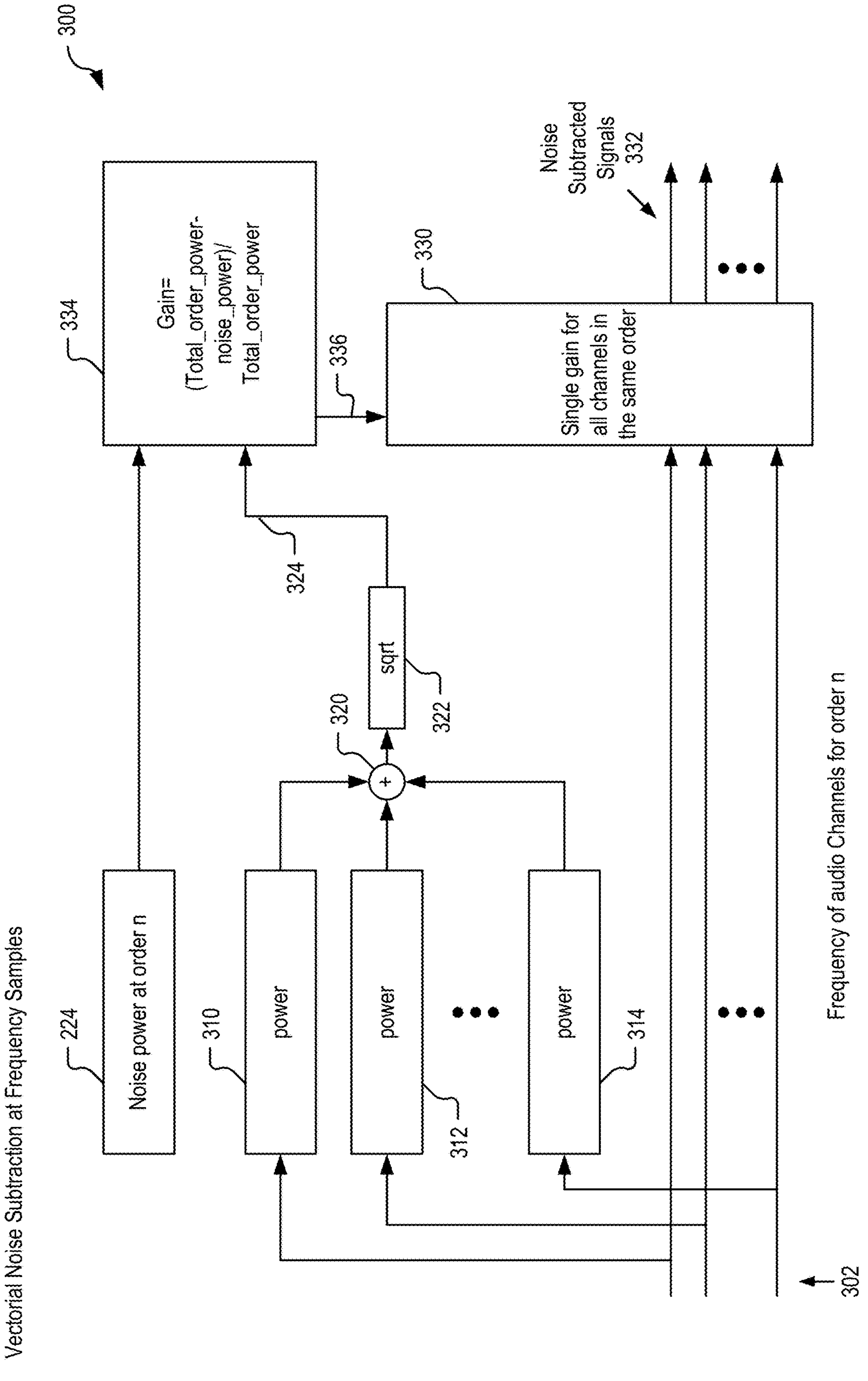
FIG. 3 is a block diagram illustrating a third implementation of components of an ambisonic noise reduction system.

As described in further detail with regard to FIG. 3, each of the frequency-domain vector-type noise subtraction circuits 124-127 of the noise reduction block 120 is configured to determine a gain value particular to the respective set 114-117 of ambisonic signals and to apply the gain value uniformly across the signals within the respective set 114-117. Applying gain values for each order of the ambisonic signals 112 independently of the other orders enables greater noise suppression at higher orders as compared to lesser noise suppression at lower orders, and applying gain values uniformly across the signals for each order preserves directional information for each order (or reduces distortion of the directional information) as compared to conventional noise reduction techniques.

Figure 2:
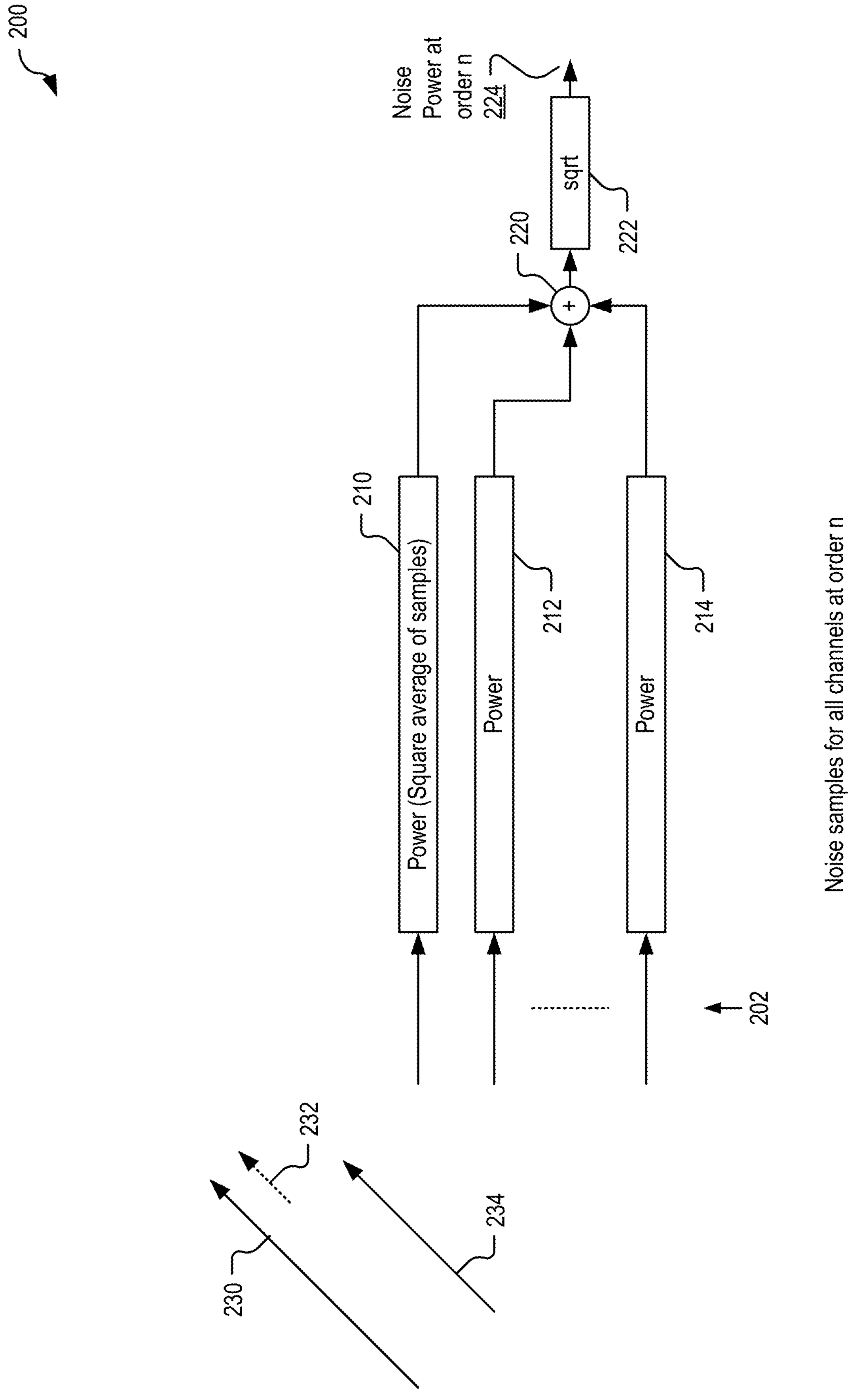
FIG. 2 is a block diagram illustrating a second implementation of components of an ambisonic noise reduction system.

FIG. 2 illustrates an example implementation 200 of components of the system 100 of FIG. 1 that are used to determine a noise power of a particular order of the ambisonic signals 112 during a period of silence to determine frequency-dependent noise of the microphone array 102 of FIG. 1 at each ambisonic order. For example, for a particular frequency, signal power at each order of an ambisonic signal (e.g., second order, N=2) can be regarded as a signal vector 230 having a length indicative of total signal power at that frequency and having direction indicating directional information among the signals corresponding to that order. Noise power of that particular order of the ambisonic signals 112 at the particular frequency is represented as a noise vector 232 having a length indicative of total noise power at that frequency and having the same (or substantially the same) direction as the signal vector 230. Subtraction of the noise vector 232 from the signal vector 230 (e.g., vector-type noise subtraction) results in a noise-reduced signal vector 234 that has reduced power (vector length) as compared to the signal vector 230 while preserving the direction of the signal vector 230.

The implementation 200 includes multiple power computation circuits 210-214. Each of the power computation circuits 210-214 is configured to receive frequency-domain noise samples 202 from a respective signal (or "channel") of the multiple signals or channels that correspond to a particular ambisonic order. For example, for first-order (N=1) noise determination, noise power is determined for each of the three first-order ambisonic channels; for second-order (N=2) noise determination, noise power is determined for each of the five second-order ambisonic channels; for third-order (N=3) noise determination, noise power is determined for each of the seven third-order ambisonic channels, for fourth-order (N=4) noise determination, noise power is determined for each of the nine fourth-order ambisonic channels, etc. Each power computation circuit 210-214 is configured to generate a channel noise power value based on a square average of the received samples 202 for that channel. Channel noise power values from each of the power computation circuits 210-214 are summed at an adder 220. A square root circuit 222 is configured to perform a square root operation to the output of the adder 220 to generate a noise power value 224 for the particular ambisonic order.

For example, a noise-only higher-order ambisonic (HOA) signal for the microphone array 102 of FIG. 1 can be generated in anechoic conditions (e.g., during factory or manufacturer testing of the microphone array 102) or quiet conditions (e.g., in response to an electronic device (e.g., a smart phone) detecting little to no ambient sound, such as during late-night or early-morning hours, prompting the electronic device to perform a calibration operation to update noise-only signal data from the microphone array 102). In a particular implementation, the noise-only HOA signal root-mean-square (rms) power N at order n and frequency f is determined as:

$$N_n(f)=\sqrt{\Sigma_{m=-n}^{n}\beta^2_{nm}(f)}$$

where $\beta^2_{nm}(f)$ represents a noise power of the m-th sub-order of the n-th order ambisonic signal (e.g., an output from one of the power computation circuits 210-214). The values of $N_n(f)$ for all values of n and f may be stored as noise data for use during noise reduction operations, as described further with reference to FIGS. 3-4.

FIG. 3 illustrates an example implementation of components 300 of the system 100 of FIG. 1 that are used to generate noise-reduced ambisonic signals of a particular order of the ambisonic signals 112. For example, the components 300 may be implemented in each of the frequency-domain vector-type noise subtraction circuits 124-127 of FIG. 1.

The components 300 includes multiple power computation circuits 310-314. Each of the power computation circuits 310-314 is configured to receive frequency-domain samples from a respective signal (channel) of the multiple signals 302 that correspond to a particular ambisonic order. For example, for first-order (N=1) power determination, signal power is determined for each of the three first-order ambisonic channels; for second-order (N=2) power determination, signal power is determined for each of the five second-order ambisonic channels. Each power computation circuit 310-314 is configured to generate a channel noise power value based on a square average of the received samples for that channel 302. Channel noise power values from each of the power computation circuits 310-314 are summed at an adder 320. A square root circuit 322 is configured to perform a square root operation to the output of the adder 320 to generate a total power value (total_order_power) 324 for the particular ambisonic order. In a particular implementation, the power computation circuits 310-314, the adder 320, and the square root circuit 322 correspond to the power computation circuits 210-214, the adder 220, and the square root circuit 222, respectively, of FIG. 2.

In a particular implementation, the signal power at each order (e.g., rms power P at order n and frequency f) is determined as:

$$P_n(f)=\sqrt{\Sigma_{m=-n}^{n}\alpha^2_{nm}(f)}$$

where $\alpha^2_{nm}$ (f) represents a signal power of the m-th channel of the n-th order ambisonic signal (e.g., an output from one of the power computation circuits 310-314).

A gain computation circuit 334 is configured to receive the noise power value (noise_power) 224 (e.g., $N_n(f)$) and the total power value (total_order_power) 324 (e.g., $P_n(f)$) and to compute a gain factor 336 based on the noise power and the total power. In a particular example, the gain factor 336 is determined based on a difference of the first total power and the first noise power, as compared to the first total power, such as gain=(total_order_power−noise_power)/(total_order_power).

In some implementations, the gain computation circuit 334 is configured to apply a smoothing parameter to a previous gain factor. The previous gain factor is based on previous frequency samples of each ambisonic signal in the set of ambisonic signals for a particular ambisonic order and at the particular frequency, such as:

$$g_n^t(f)=\gamma g_n^{t-1}(f)+(1-\gamma)\frac{P_n(f)-\delta(f)N_n(f)}{P_n(f)}$$

where $g_n^t$ (f) represents the gain factor 336 at frequency f for a set of samples corresponding to a time frame t and for ambisonic order n, δ represents an aggressiveness and can vary with frequency—how much of noise power to subtract—and has a value between 0-1, γ represents a smoothing parameter that affects how quickly the gain changes over time, and $g_n^{t-1}(f)$ represents the previous gain factor at frequency f for a set of samples corresponding to a time frame t−1 that precedes time frame t and for ambisonic order n.

A scaling circuit 330 is configured to scale the samples of each of the ambisonic signals 302 of the order based on the gain factor 336. In an example, each of the signals 302 may be multiplied by the gain factor 336 to generate noise-subtracted signals 332. In a particular example, scaling the samples of each ambisonic signal 302 in each of the sets 114, 115, 116, and 117, based on the particular gain factor 336 that is computed for that set 114, 115, 116, or 117, reduces noise without distorting directional information corresponding to that set 114, 115, 116, or 117.

In conjunction with the implementations depicted in FIGS. 1-3, a device to apply noise reduction to ambisonic signals includes the memory 140 configured to store noise data 142 corresponding to microphones in the microphone array 102. The device also includes the processor 101. The processor 101 is configured to perform, via the ambisonics conversion circuit 110, signal processing operations on signals (e.g., the audio data 104) captured by microphones in the microphone array 102 to generate multiple sets 114-117 of ambisonic signals 112. The multiple sets 114-117 of the ambisonic signals 112 include a first set (e.g., set 115) corresponding to a first particular ambisonic order (e.g., first order) and a second set (e.g., set 116) corresponding to a second particular ambisonic order (e.g., second order). In the following example implementation, the first particular ambisonic order is the first order (order n=1), the second particular ambisonic order is the second order (order n=2), the first set of ambisonic signals is the set 115, and the second set of ambisonic signals is the set 116. Although examples provided herein described operation using order n=1 and n=2 for ease of explanation, it should be clearly understood that the techniques described herein are not limited to n=1 and n=2 and may be applied to any number of orders.

The processor 101 is configured to perform a first noise reduction operation that includes applying a first gain factor to each ambisonic signal in the first set (set 115). The first gain factor is based on the noise data 142. To illustrate, the frequency-domain vector-type noise subtraction circuit 125 includes a copy of the scaling circuit 330 of FIG. 3 that applies a version of the gain factor 336 that is computed for the first order ambisonic signals (order n=1) and that is partially based on a version of the noise power 224 determined for order n=1. In some implementations, the version of the noise power 224 for order n=1 includes first frequency-based noise data corresponding to the first particular ambisonic order (order n=1) and is included in the noise data 142.

The processor 101 is also configured to perform a second noise reduction operation that includes applying a second gain factor to each ambisonic signal in the second set (set 116). The second gain factor for order n=2 is based on the noise data 142 and is distinct from the first gain factor for order n=1. To illustrate, the frequency-domain vector-type noise subtraction circuit 126 includes a copy of the scaling circuit 330 of FIG. 3 that applies a version of the gain factor 336 that is computed for the second order ambisonic signals (order n=2) and that is partially based on a version of the noise power 224 determined for order n=2. In some implementations, the version of the noise power 224 for order n=2 includes second frequency-based noise data corresponding to the second particular ambisonic order (order n=2) and is included in the noise data 142.

In some implementations, the processor 101 is configured to calculate the first frequency-based noise data by determining a power of each channel of the first particular ambisonic order (order n=1) during silence, using the power computation circuits 210-214 of FIG. 2, generating a first sum of the power of each channel of the first particular ambisonic order using the adder 220, and determining a first noise power 224 at the first particular ambisonic order (order n=1) based on the first sum and as provided at the output of the square root circuit 222. The processor 101 is also configured to use the power computation circuits 210-214, the adder 220, and the square root circuit 222 to determine a power of each channel of the second particular ambisonic order (order n=2) during silence, to generate a second sum of the power of each channel of the second particular ambisonic order, and to determine a second noise power 224 at the second particular ambisonic order (order n=2) based on the second sum.

In some implementations, the processor 101 is further configured to perform the first noise reduction operation using a copy of the components 300 in the frequency-domain vector-type noise subtraction circuit 125 by determining a first total power (total power value 324 at order n=1) based on a sum of powers of the ambisonic signals 312 in the first set (set 115) at the particular frequency, determining the first gain factor 336 based on the first noise power 224 (at order n=1) and the total power value 324, and scaling samples of each ambisonic signal in the first set 115 at the particular frequency based on the first gain factor 336.

Although in the example described above, the first particular ambisonic order is order n=1 and the second particular ambisonic order is order n=2, in other examples the first particular ambisonic order and the second particular ambisonic order correspond to different ambisonic orders. In an illustrative example, the first particular ambisonic order corresponds to a third order (n=3), and the channels of the first particular ambisonic order correspond to third order ambisonic channels.

In some implementations, the processor 101 is configured to receive, via a user interface, one or more user inputs corresponding to parameters of at least one of the first noise reduction operation or the second noise reduction operation. For example, the processor 101 may be incorporated in a device that includes a display screen and may be configured to generate the user interface for display at the display screen, such as described in further detail with reference to FIG. 5.

Figure 4A:
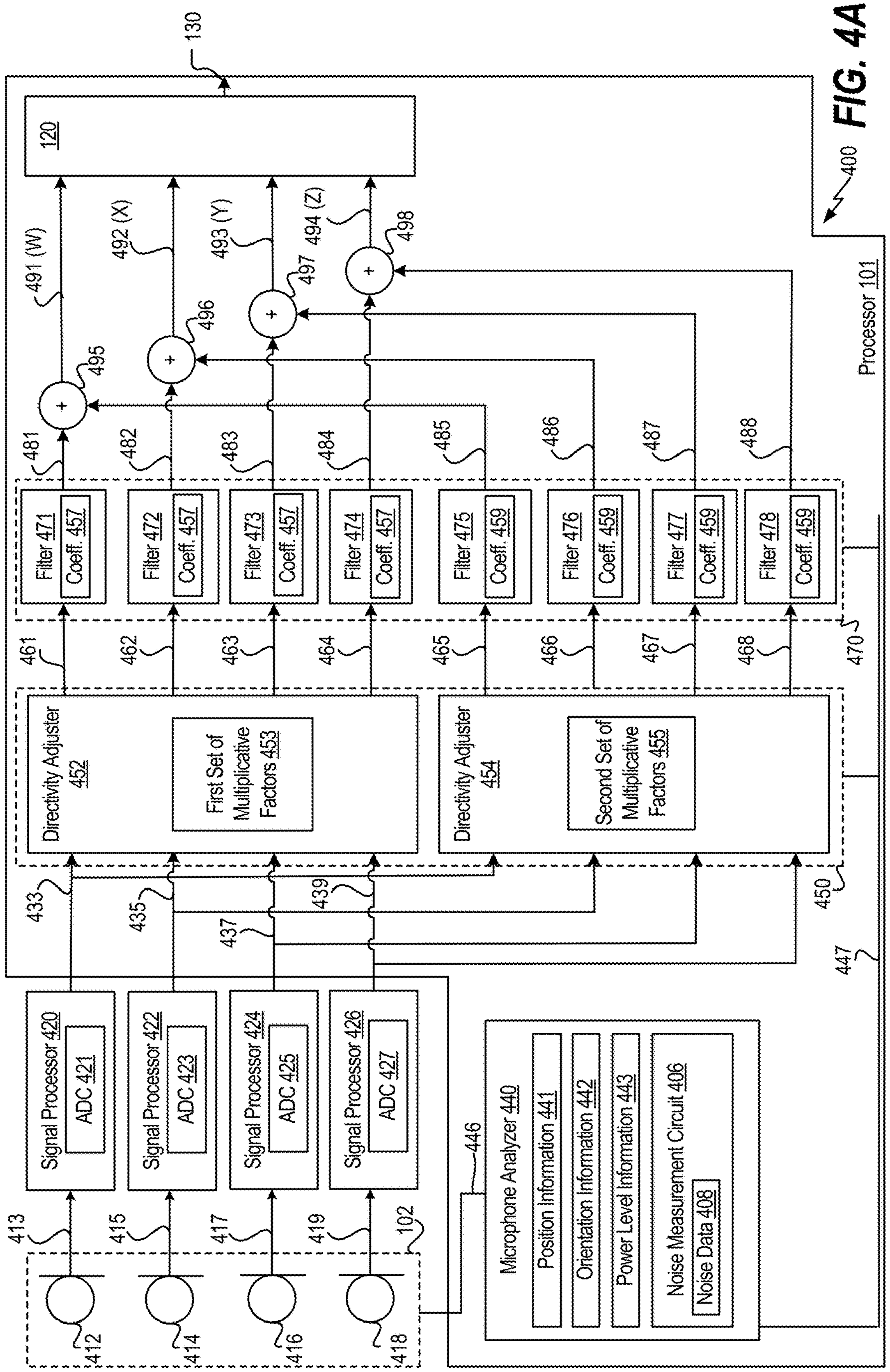
FIG. 4A is a block diagram illustrating a fourth implementation of components of an ambisonic noise reduction system.

Referring to FIG. 4A, an implementation of components of a system 400 for generating noise-reduced ambisonic signals is shown. The system 400 includes the processor 101 and the microphone array 102 of FIG. 1. As non-limiting examples, the system 100, the system 400, or any combination thereof may be integrated into a robot, a mobile phone, a head-mounted display, a virtual reality headset, or an optical wearable (e.g., glasses).

The microphone array 102 includes a microphone 412, a microphone 414, a microphone 416, and a microphone 418. According to one implementation, at least one microphone 412, 414, 416, 418 is an omnidirectional microphone. For example, at least one microphone 412, 414, 416, 418 is configured to capture sound with approximately equal gain for all sides and directions. According to one implementation, at least one of the microphones 412, 414, 416, 418 is a microelectromechanical system (MEMS) microphone.

In some implementations, the microphones 412, 414, 416, 418 are positioned in a tetrahedral configuration. However, it should be understood that the microphones 412, 414, 416, 418 may be arranged in different configurations (e.g., a spherical configuration, such as an Eigenmike or Zylia spherical array, a triangular configuration, a random configuration, etc.). Although the microphone array 102 is shown to include four microphones, in other implementations, the microphone array 102 may include fewer than four microphones or more than four microphones. For example, the microphone array 102 may include three microphones, eight microphones, or any other number of microphones.

The system 400 also includes signal processing circuitry that is coupled to the microphone array 102. The signal processing circuitry includes a signal processor 420, a signal processor 422, a signal processor 424, and a signal processor 426. The signal processing circuitry is configured to perform signal processing operations on analog signals captured by each microphone 412, 414, 416, 418 to generate digital signals.

To illustrate, the microphone 412 is configured to capture an analog signal 413, the microphone 414 is configured to capture an analog signal 415, the microphone 416 is configured to capture an analog signal 417, and the microphone 418 is configured to capture an analog signal 419. The signal processor 420 is configured to perform first signal processing operations (e.g., filtering operations, gain adjustment operations, analog-to-digital conversion operations) on the analog signal 413 to generate a digital signal 433. In a similar manner, the signal processor 422 is configured to perform second signal processing operations on the analog signal 415 to generate a digital signal 435, the signal processor 424 is configured to perform third signal processing operations on the analog signal 417 to generate a digital signal 437, and the signal processor 426 is configured to perform fourth signal processing operations on the analog signal 419 to generate a digital signal 439. Each signal processor 420, 422, 424, 426 includes an analog-to-digital converter (ADC) 421, 423, 425, 427, respectively, to perform the analog-to-digital conversion operations. According to one implementation, the ADCs 421, 423, 425, 427 are integrated into a coder/decoder (CODEC). According to another implementation, the ADCs 421, 423, 425, 427 are stand-alone ADCs. According to yet another implementation, the ADCs 421, 423, 425, 427 are included in the microphone array 102. Thus, in some scenarios, the microphone array 102 may generate the digital signals 433, 435, 437, 439.

Each digital signal 433, 435, 437, 439 is provided to one or more directivity adjusters 450 of the processor 101. In FIG. 4A, two directivity adjusters 452, 454 are shown. However, it should be understood that any number of directivity adjusters may be included in the system 400. The number of active directivity adjusters 450 may be selected based on information generated at a microphone analyzer 440 of the processor 101, as described below.

The microphone analyzer 440 is coupled to the microphone array 102 via a control bus 446, and the microphone analyzer 440 is coupled to the directivity adjusters 450 and the filters 470 via a control bus 447. In some implementations, the microphone analyzer 440 is configured to determine position information 441 for each microphone of the microphone array 102, orientation information 442 for each microphone of the microphone array 102, and power level information 443 for each microphone of the microphone array 102. Based on the position information 441, the orientation information 442, and the power level information 443, the processor 101 selects a number of directivity adjusters 450 to activate, sets of multiplicative factors 453 and 455 to be used at the active directivity adjusters 450, one or more sets of the filters 471-478 to activate, and filter coefficients 459 for each of the activated filters 471-478.

The microphone analyzer 440 enables the processor 101 to compensate for flexible positioning of the microphone (e.g., a "non-ideal" tetrahedral microphone arrangement) by adjusting the number of active directivity adjusters 450, filters 470, multiplicative factors 453, 455, and filter coefficients 457, 459 based on the position of the microphones, the orientation of the microphones, etc. The directivity adjusters 450 and the filters 470 apply different transfer functions to the digital signals 433, 435, 437, 439 based on the placement and directivity of the microphones 412, 414, 416, 418.

The microphone analyzer 440 also includes a noise measurement circuit 408 configured to generate the noise data 142. For example, the noise measurement circuit 408 may include the components illustrated in FIG. 2 and may be activated by the processor 101 during a period of silence to generate the noise data 142.

The directivity adjuster 452 may be configured to apply the first set of multiplicative factors 453 to the digital signals 433, 435, 437, 439 to generate a first set of ambisonic signals 461-464. For example, the directivity adjuster 452 may apply the first set of multiplicative factors 453 to the digital signals 433, 435, 437, 439 using a first matrix multiplication. The first set of ambisonic signals includes a W signal 461, an X signal 462, a Y signal 463, and a Z signal 464.

The directivity adjuster 454 may be configured to apply the second set of multiplicative factors 455 to the digital signals 433, 435, 437, 439 to generate a second set of ambisonic signals 465-168. For example, the directivity adjuster 454 may apply the second set of multiplicative factors 455 to the digital signals 433, 435, 437, 439 using a second matrix multiplication. The second set of ambisonic signals includes a W signal 465, an X signal 466, a Y signal 467, and a Z signal 468. In other implementations, the first and second sets of ambisonic signal include higher-order ambisonic signals (e.g., n=2, n=3, etc.).

The first set of filters 471-474 are configured to filter the first set of ambisonic signals 461-164 to generate a filtered first set of ambisonic signals 481-484. The second set of filters 475-478 are configured to filter the second set of ambisonic signals 465-468 to generate a filtered second set of ambisonic signals 485-488.

The system 400 also includes combination circuitry 495-498 coupled to the first set of filters 471-474 and to the second set of filters 475-478. The combination circuitry 495-498 is configured to combine the filtered first set of ambisonic signals 481-484 and the filtered second set of ambisonic signals 485-488 to generate a processed set of ambisonic signals 491-494. In an example, the ambisonic signal 491 corresponds to the set 114 of FIG. 1 (order n=0) and the ambisonic signals 492-494 correspond to the set 115 of FIG. 1 (order n=1), and other sets of ambisonic signals (not shown) can be generated corresponding to sets 116-117 of FIG. 1.

The ambisonic signals and the noise data 142 are provided to the noise reduction block 120 to generate the noise reduced ambisonics signals 130, such as described with reference to FIG. 1 and FIG. 3.

Figure 4B:
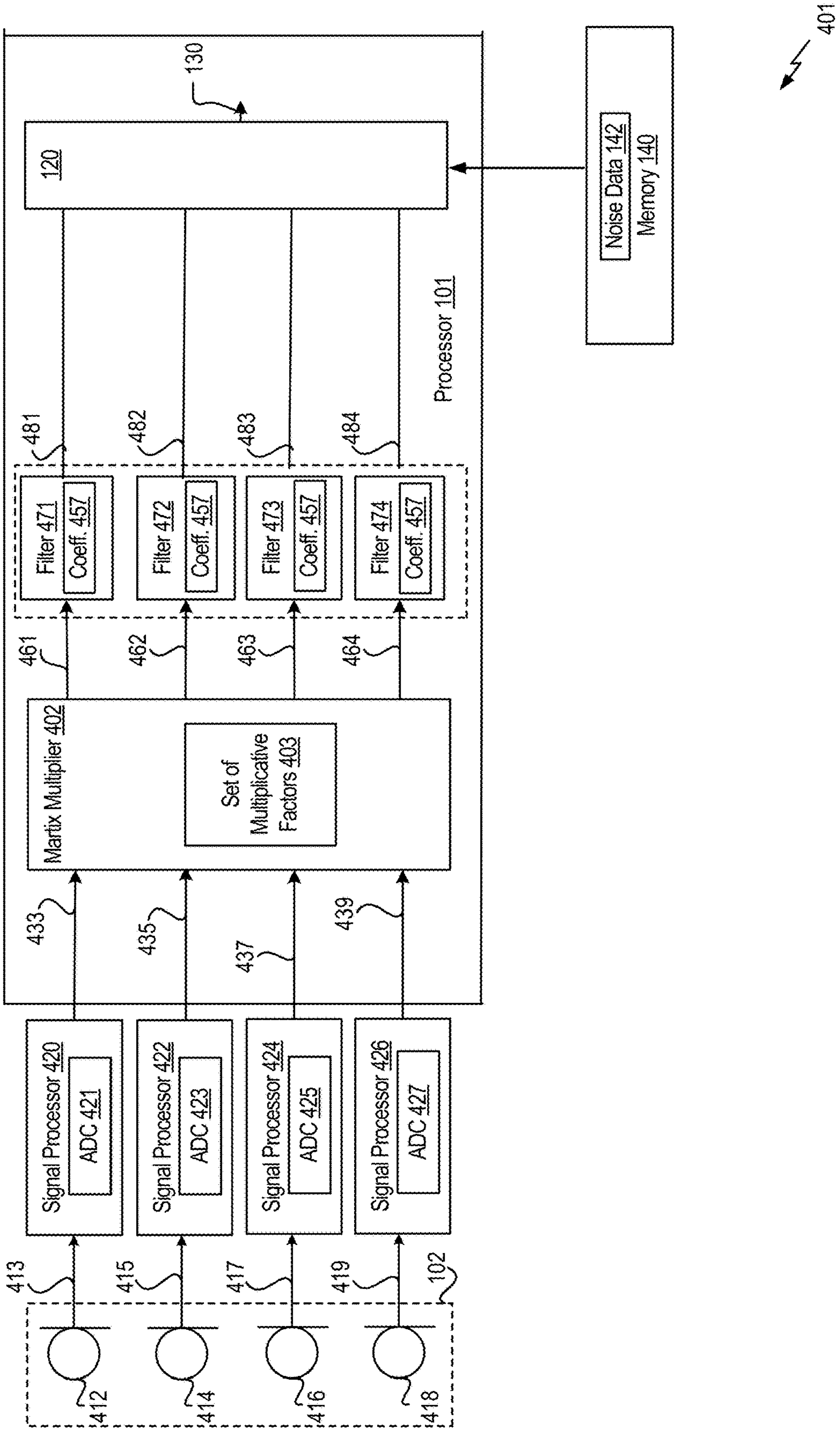
FIG. 4B is a block diagram illustrating a fifth implementation of components of an ambisonic noise reduction system.

FIG. 4B illustrates another example implementation of a system 401 that includes components of the system 400 of FIG. 4A but omits components directed to adjustability and flexibility of antenna placement and orientation, such as the microphone analyzer 440, the filters 475-478, the combination circuitry 495-498, and the directivity adjusters 450.

The digital signals 433-439 are processed at a matrix multiplier 402 that is configured to perform multiplication operations using a set of multiplicative factors 403 to generate the ambisonic signals 461-464. In some implementations, the matrix multiplier 402 corresponds to the ambisonics conversion circuit 110 of FIG. 1B. The noise data 142 is depicted in the memory 140 and accessible to the noise reduction block 120. However, in other embodiments, all or part of the noise data 142 is stored within the processor 101, such as in a nonvolatile storage (e.g., flash cells, read-only memory (ROM)) or a volatile storage (e.g., registers) accessible to, or included within, the noise reduction block 120.

As compared to the system 400 of FIG. 4A, the system 401 has reduced cost, power consumption, and complexity. In some implementations, the system 401 is configured to generate ambisonic signals based on a single arrangement of the microphones 412, 414, 416, and 418, such as when the microphones 412, 414, 416, and 418 are at fixed locations. As a non-limiting example, the system 401 may be implemented in portable electronic devices having a fixed antenna arrangement. Examples of various portable electronic devices are illustrated in FIGS. 5 and 6A-6D The system 400 and the system 401 provide illustrative, non-limiting examples of systems that include the noise reduction block 120 of FIG. 1 and that are configured to perform noise reduction for ambisonic signals. Because the systems 400 and 401 convert the captured sounds to ambisonics, the captured sounds may be played back over a plurality of loudspeaker configurations and the captured sounds may be rotated to adapt to a consumer head position. Although the techniques of FIGS. 4A and 4B (in addition to FIGS. 4C and 4D, below) may be described with respect to first order ambisonics, it should be appreciated that the techniques are not limited to first order ambisonics and may also be performed using higher order ambisonics.

Figure 4E:
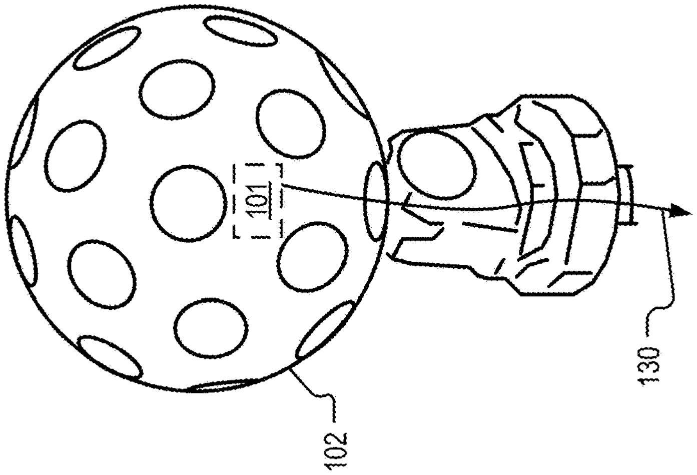
FIG. 4E is a block diagram illustrating an eighth implementation of components of an ambisonic noise reduction system.
Figure 4D:
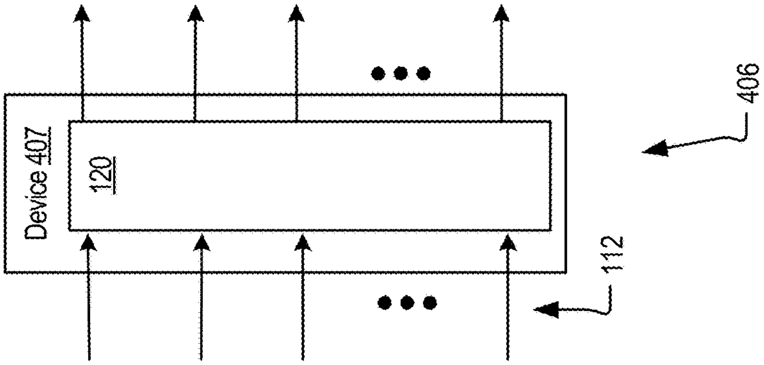
FIG. 4D is a block diagram illustrating a seventh implementation of components of an ambisonic noise reduction system.
Figure 4C:
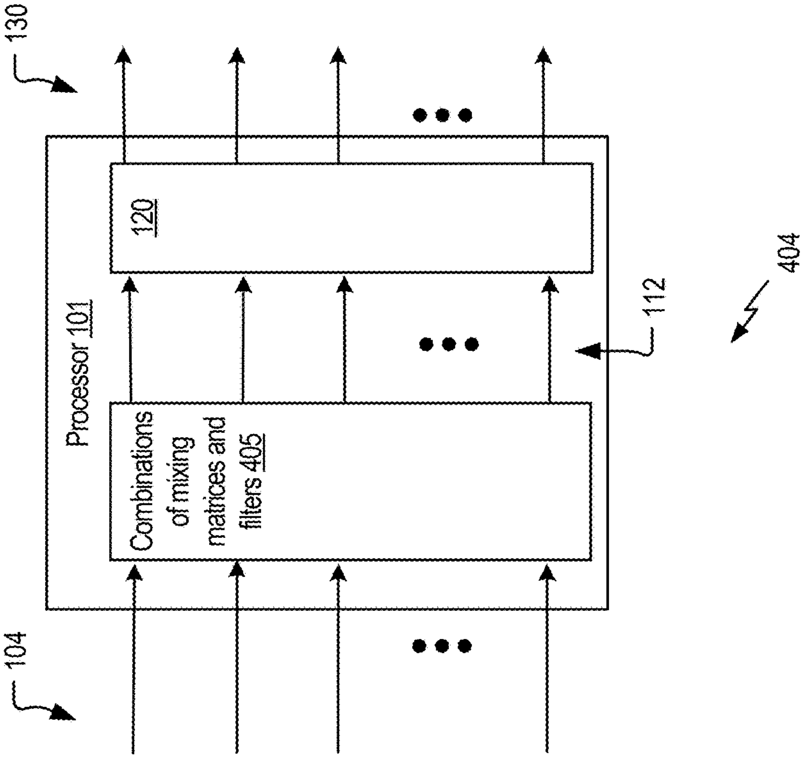
FIG. 4C is a block diagram illustrating a sixth implementation of components of an ambisonic noise reduction system.

FIG. 4C illustrates another example implementation of a system 404 that omits components that are peripheral to noise reduced ambisonic signal generation, such as the microphone array 102, the signal processors 420, 422, 424, and 426, and the memory 140. The processor 101 is configured to receive the audio data 104 from a microphone array, such as 'M' microphones on a device or structure, such as microphones on a three-dimensional (3D) camera or on a rigid sphere (e.g., an Eigenmike). The processor 101 includes combinations of mixing matrices and filters 405. For example, the combinations 405 may include circuitry configured to combine mixing matrix multiplication operations and filtering operations to generate the ambisonic signals 112 (e.g. 'V' signal output of ambisonic data) that are input into the noise reduction block 120. In some implementations, the combinations 405 combine matrix multiplications operations of the matrix multiplier 402 and filtering operations of the filters 471-474 into a combined processing operation, rather than the serial operations (e.g., multiplication followed by filtering) illustrated in FIGS. 4A-4B.

FIG. 4D illustrates another example implementation of a system 406 to generate noise reduced ambisonic signals. A device 407 (e.g., a chip or integrated circuit) includes the noise reduction block 120, inputs (e.g., pins or pads) configured to receive ambisonic signals 112 (e.g., from a remote ambisonic antenna array and signal conversion processor) and outputs (e.g., pins or pads) configured to output the noise reduced ambisonics signals 130 (e.g., to a remote playback loudspeaker system). In some implementations, noise data 142 may be received via one or more inputs and stored at the device 407 for use at the noise reduction block 120.

FIG. 4E illustrates an example implementation of a system in which the processor 101 is within the microphone array 102. In FIG. 4E, the microphone array 102 has a substantially spherical housing with regularly spaced microphones. The processor 101 is within the housing and coupled to receive and process audio data from the microphones. The noise-reduced ambisonics signals 130 generated by the processor 101 are provided as output signals of the microphone array 102. Thus, the microphone array 102 may function as an "intelligent array" that outputs noise reduced ambisonic signals, enabling ambisonic sound with a reduced number of components, increased simplicity of system setup, and enhanced component interoperability, as compared to systems in which a microphone array and an ambisonic processor are separate components that are manually configured to operate with each other. Although illustrated as spherical, in other implementations the microphone array 102 has other configurations.

Thus, FIGS. 4A-4E illustrate non-limiting examples of various architectures in which the present techniques can be applied to generate noise-reduced ambisonic signals.

Figure 5:
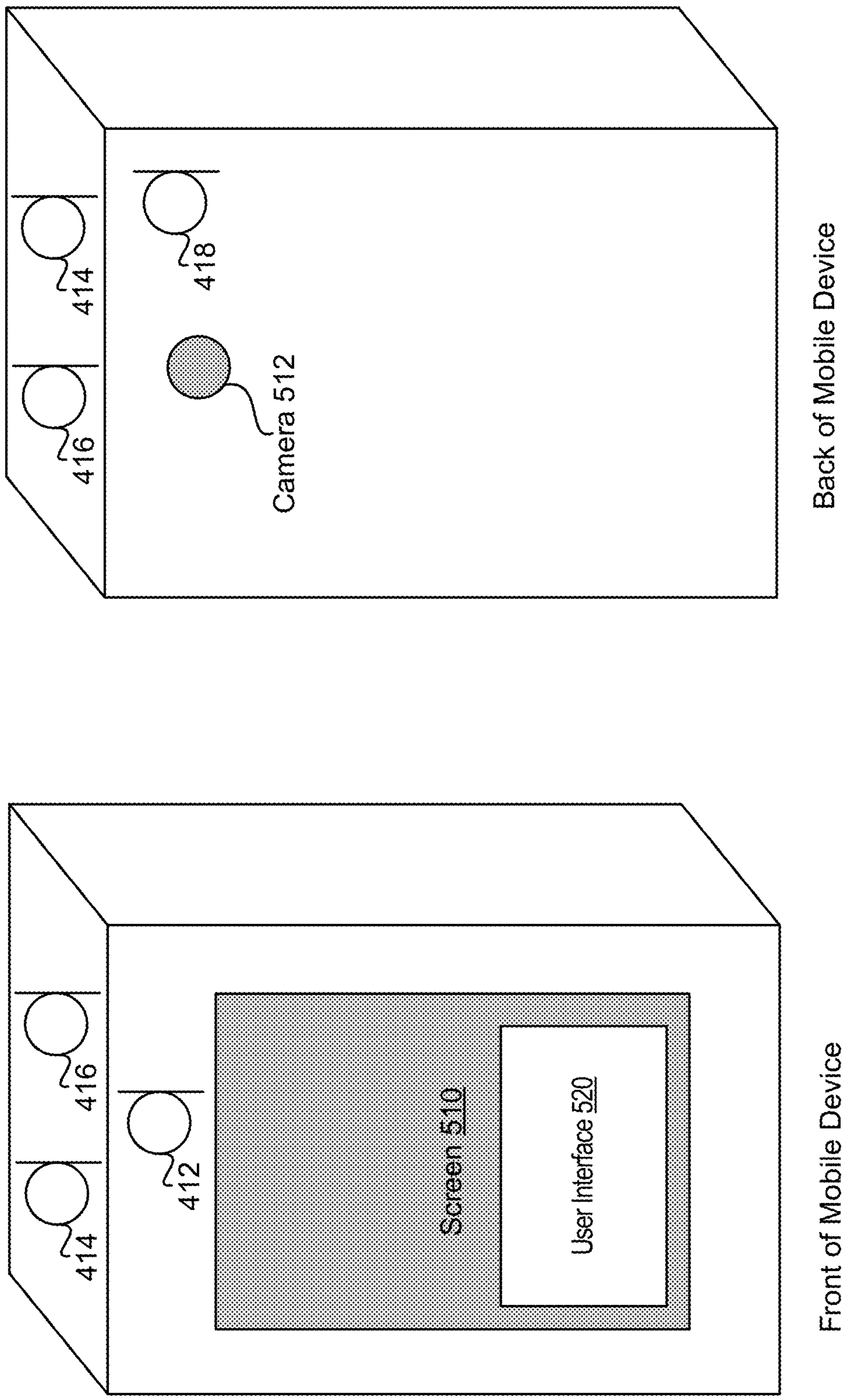
FIG. 5 illustrates an illustrative implementation of a mobile device that includes components of the microphone array of FIG. 1B.

Referring to FIG. 5, a mobile device (e.g. a mobile phone) that includes the components of the microphone array 102 of FIGS. 4A-4B is shown. According to FIG. 5, the microphone 412 is located on a front side of the mobile device. For example, the microphone 412 is located near a screen 510 of the mobile device. The microphone 418 is located on a back side of the mobile device. For example, the microphone 418 is located near a camera 512 of the mobile device. The microphones 414, 416 are located on top of the mobile device.

A user interface 520 may be displayed on the screen 510, such as a touch screen, to enable a user to provide user input corresponding to a noise reduction operation. For example, in some implementations the user interface 520 enables the user to select or adjust values of the aggressiveness parameter δ, the smoothing parameter γ, or a combination thereof, that are described with reference to FIG. 3, overall or individually for each order. For example, in some implementations the user input indicates a single value of the parameter for multiple ambisonic orders, and in other implementations the user input indicates individual values of the parameter for multiple ambisonic orders.

In another example, the user input indicates a playback system. For example, in some implementations the user interface 520 enables the user to indicate a loudspeaker configuration that is to be used for playback. Based on the loudspeaker configuration, one or more aspects of noise reduction may be adjusted. For example, if the user input indicates a loudspeaker configuration that uses a relatively low number of channels, such as 5.1, binaural or 7.1.4, a parameter for noise reduction is selected based on the playback system. For binaural a less aggressive noise reduction may be used since playback is over two channels. As more channels are added, more aggressive noise reduction can be applied. Thus, the user interface 520 enables user selection of aggressiveness of noise reduction. In some implementations, aggressiveness of noise reduction (e.g., a value of the aggressiveness parameter δ) is automatically adjusted based on playback history instead of via direct user input via the user interface 520. For example, if a history of playback is primarily binaural then noise reduction can be automatically set to be less aggressive as compared to a history of playback primarily on 5.1 systems. In some implementation where noise reduction aggressiveness is automatically selected based on a history of playback speaker configurations, the user interface 520 is omitted, while in other such implementations the user interface 520 is included and enables a user to override an automatically-selected aggressiveness setting.

In some implementations, power savings may be obtained using a field of view (FOV) or region-based system based on a camera, such as the optical wearable described with reference to FIG. 6A or the augmented reality headset described with reference to FIG. 6D. In some implementations, noise reduction is bypassed for a particular ambisonic order if the vector direction for the particular ambisonic order is not within the FOV. In some implementations, noise reduction is performed at reduced gain depending on the normalized direction between the center of FOV and the order vector.

Figure 6A:
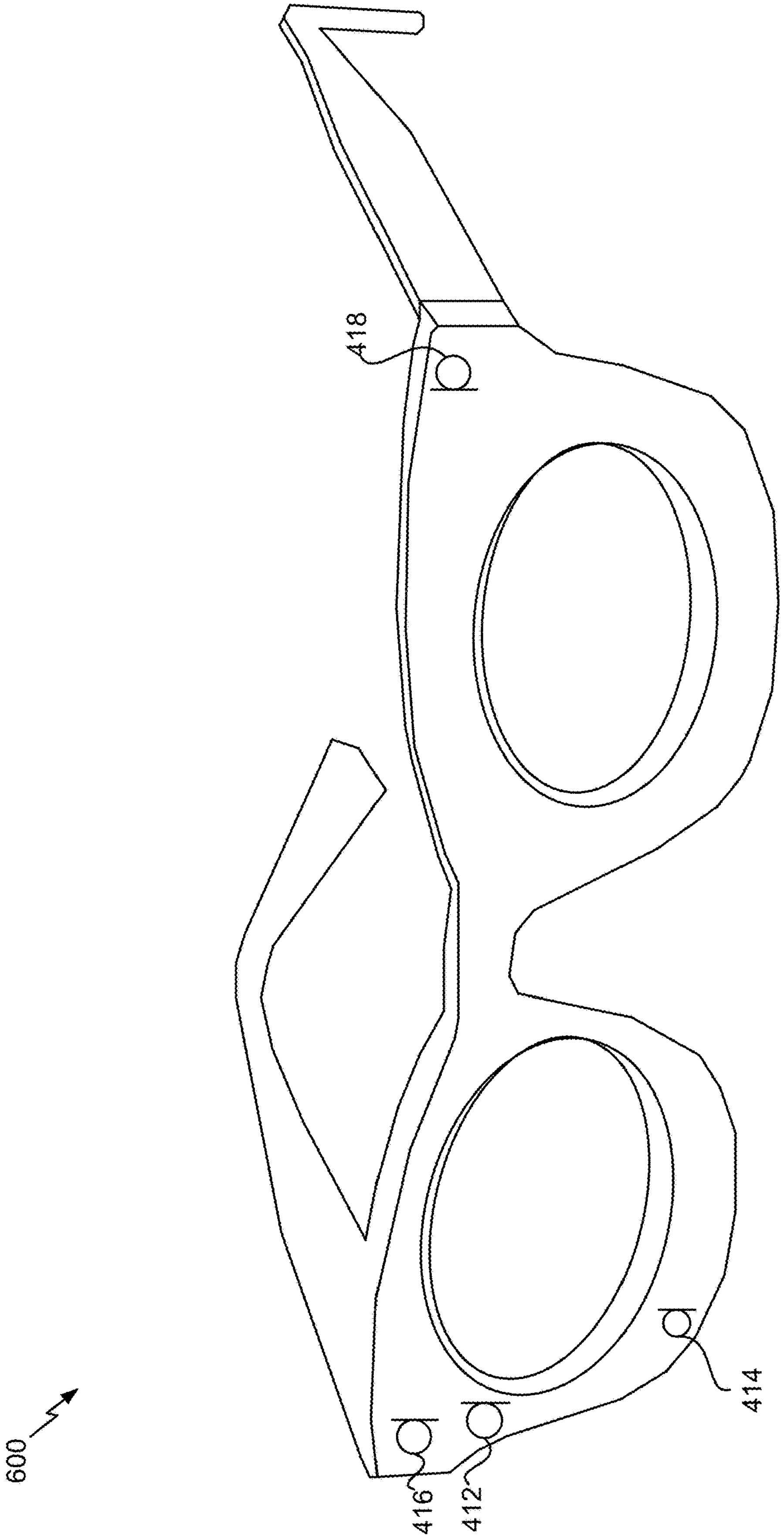
FIG. 6A illustrates an illustrative implementation of an optical wearable that includes components of the microphone array in FIG. 1B.

Referring to FIG. 6A, an optical wearable 600 that includes the components of the microphone array 102 of FIGS. 4A-4B is shown. According to FIG. 6A, the microphones 412, 414, 416 are located on a right side of the optical wearable 600, and the microphone 418 is located on a top-left corner of the optical wearable 600.

Figure 6B:
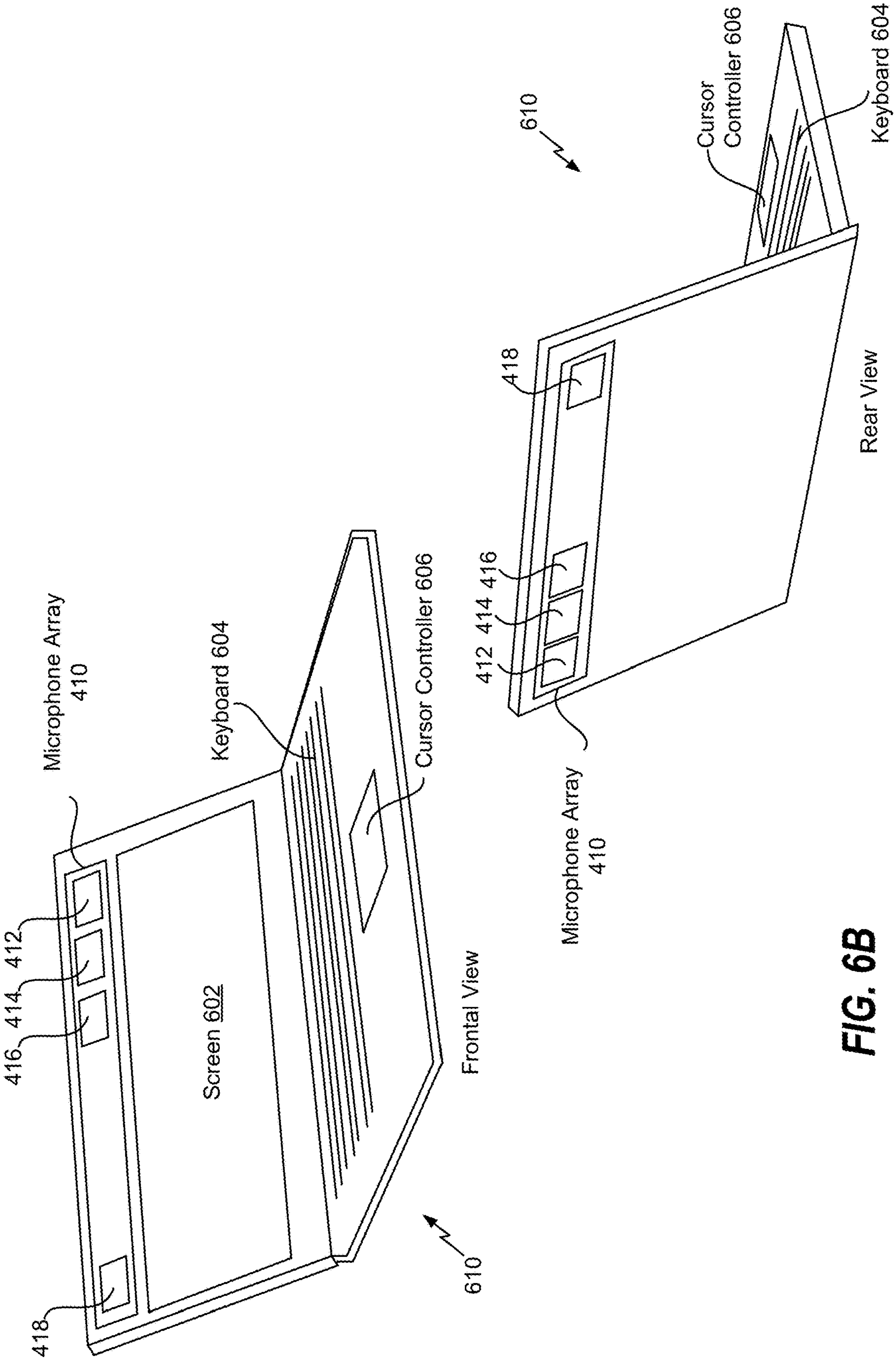
FIG. 6B illustrates an illustrative implementation of a computer that includes components of the microphone array in FIG. 1B.
Figure 6D:
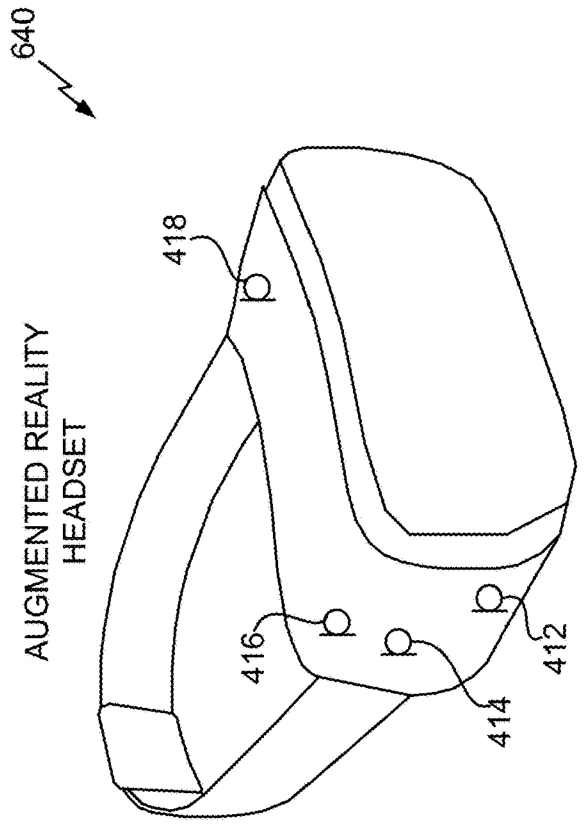
FIG. 6D illustrates an illustrative implementation of an augmented reality headset that includes components of the microphone array in FIG. 1B.

Referring to FIG. 6B, a computer 610 (e.g., a laptop) that includes the components of the microphone array 102 of FIGS. 4A-4B is shown. The computer 610 includes a screen 602, a keyboard 604, and a cursor controller 606. In FIG. 6B, a frontal view of the computer 610 is shown and a rear view of the computer 610 is shown. As illustrated in FIG. 6B, the microphone array 102 is located above the screen 602. However, in other implementations, the microphone array 102 may be positioned at other locations of the computer 610. As non-limiting examples, the microphone array 102 may be positioned along a bottom portion (e.g., by the cursor controller 606) of the computer 610 or may be positioned along a side portion of the computer 610.

Figure 6C:
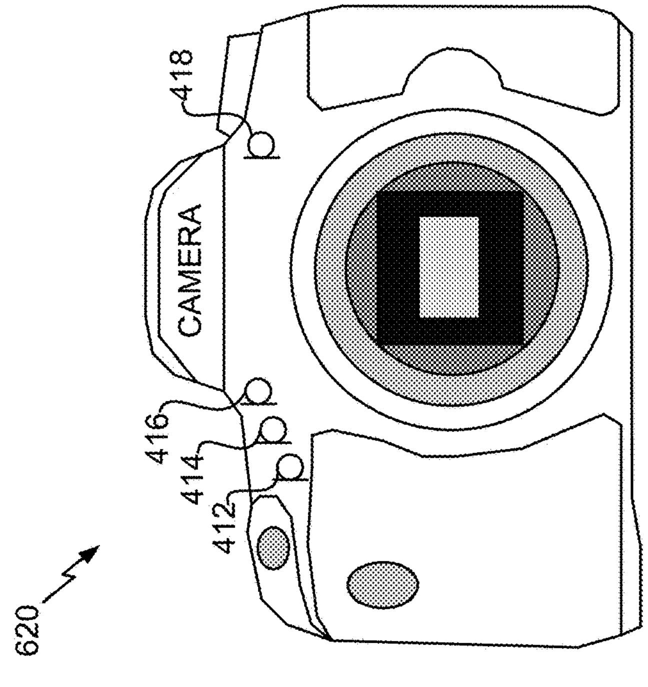
FIG. 6C illustrates an illustrative implementation of a camera that includes components of the microphone array in FIG. 1B.

Referring to FIG. 6C, a camera 620 that includes the components of the microphone array 102 of FIGS. 4A-4B is shown. Referring to FIG. 6D, an augmented reality headset 640 that includes the components of the microphone array 102 of FIGS. 4A-4B is shown.

Figure 7:
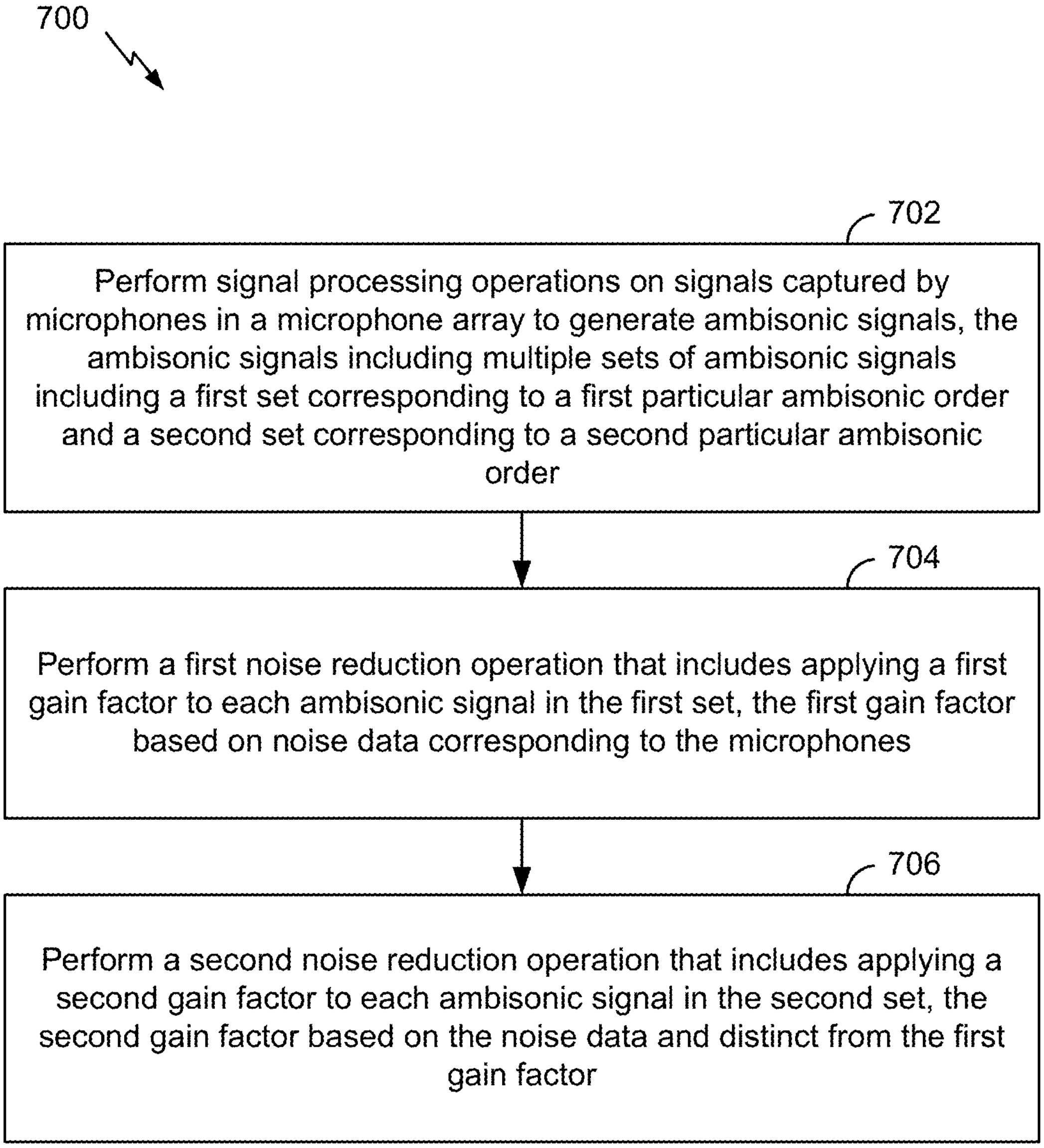
FIG. 7 illustrates an example of a method for noise reduction of ambisonic signals.

Referring to FIG. 7, a method 700 for noise reduction in ambisonic signals is shown. The method 700 (or portions of the method 700) may be performed by the system 100 of FIG. 1B, the system 400 of FIG. 4A, the system 401 of FIG. 4B, the system 404 of FIG. 4C, the system 406 of FIG. 4D, or a combination thereof. For example, the method 700 may be performed by the processor 101 of FIG. 1

The method 700 includes performing signal processing operations on signals captured by microphones in a microphone array to generate ambisonic signals, at 702. The ambisonic signals include multiple sets of ambisonic signals including a first set corresponding to a first particular ambisonic order and a second set corresponding to a second particular ambisonic order. In a particular example, the first particular ambisonic order is order=1 and the second particular ambisonic order=2. In another example, the first particular ambisonic order corresponds to order=4 and the second particular ambisonic order corresponds to order=6. In general, the method 700 is implemented with the first particular ambisonic order corresponding to order='A' and the second particular ambisonic order corresponding to order='B', where A and B are any positive integers, A not equal to B.

The method 700 includes, at 704, performing a first noise reduction operation that includes applying a first gain factor to each ambisonic signal in the first set. The first gain factor is based on noise data corresponding to the microphones. The method 700 also includes, at 706, performing a second noise reduction operation that includes applying a second gain factor to each ambisonic signal in the second set. The second gain factor is based on the noise data and distinct from the first gain factor.

Although the method 700 is described as including two noise reduction operations, it should be understood that any number of noise reduction operations may be performed. To illustrate, in an implementation in which the generated ambisonic signals includes signals of order 0, 1, 2, 3, and 4, such as illustrated in FIG. 1A, the method 700 can include five noise reduction operations: a first noise reduction operation that includes applying a first gain factor to the ambisonic signal of n=0, a second noise reduction operation that includes applying a second gain factor to the ambisonic signals of n=1, a third noise reduction operation that includes applying a third gain factor to the ambisonic signals of n=2, a fourth noise reduction operation that includes applying a fourth gain factor to the ambisonic signals of n=3, and a fifth noise reduction operation that includes applying a fifth gain factor to the ambisonic signals of n=4.

Performing noise reduction by applying separate gain values to different orders of ambisonic signal reduces distortion of direction information and reduces sound quality artefacts as compared to performing noise reduction at the microphones, at the loudspeakers, or both.

Figure 8:
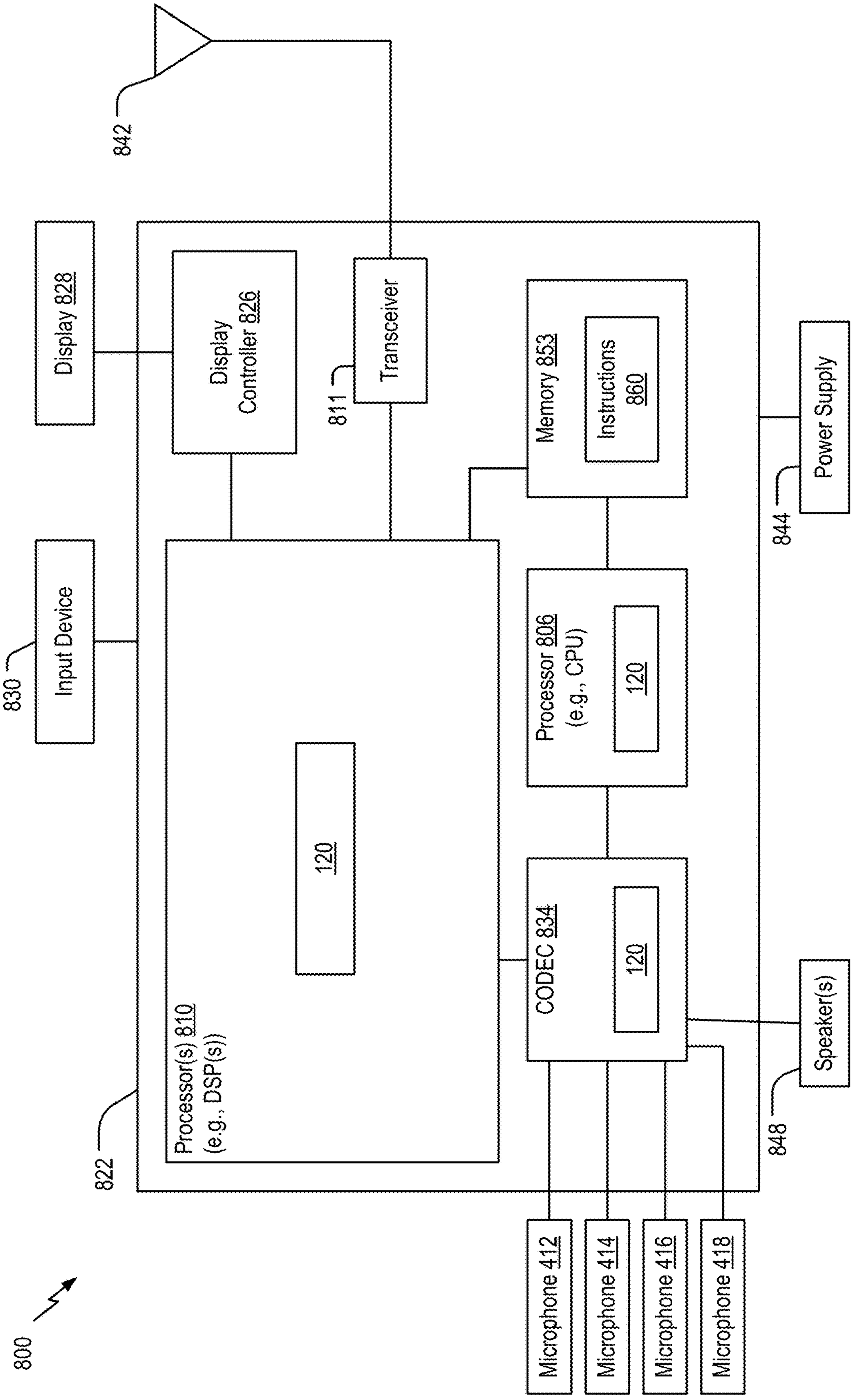
FIG. 8 is a block diagram of a particular illustrative example of a mobile device that is operable to perform the techniques described with reference to FIGS. 1A-7.

Referring to FIG. 8, a block diagram of a particular illustrative implementation of a device (e.g., a wireless communication device) is depicted and generally designated 800. In various implementations, the device 800 may have more components or fewer components than illustrated in FIG. 8.

In a particular implementation, the device 800 includes a processor 806, such as a central processing unit (CPU) or a digital signal processor (DSP), coupled to a memory 853. The memory 853 includes instructions 860 (e.g., executable instructions) such as computer-readable instructions or processor-readable instructions. The instructions 860 may include one or more instructions that are executable by a computer, such as the processor 806 or a processor 810, such to perform operations in accordance with the method 700 of FIG. 7.

FIG. 8 also illustrates a display controller 826 that is coupled to the processor 810 and to a display 828. A coder/decoder (CODEC) 834 may also be coupled to the processor 806. A speaker 836 and the microphones 412, 414, 416, 418 may be coupled to the CODEC 834. The CODEC 834 includes the noise reduction block 120 and other components of the system 100. In other implementations, the processors 806, 810 may include the noise reduction block 120, other components of the system 100, or a combination thereof.

A transceiver 811 may be coupled to the processor 810 and to an antenna 842, such that wireless data received via the antenna 842 and the transceiver 811 may be provided to the processor 810. In some implementations, the processor 810, the display controller 826, the memory 853, the CODEC 834, and the transceiver 811 are included in a system-in-package or system-on-chip device 822. In some implementations, an input device 830 and a power supply 844 are coupled to the system-on-chip device 822. Moreover, in a particular implementation, as illustrated in FIG. 8, the display 828, the input device 830, the speaker 836, the microphones 412, 414, 416, 418, the antenna 842, and the power supply 844 are external to the system-on-chip device 822. In a particular implementation, each of the display 828, the input device 830, the speaker 836, the microphones 412, 414, 416, 418, the antenna 842, and the power supply 844 may be coupled to a component of the system-on-chip device 822, such as an interface or a controller.

The device 800 may include a headset, a mobile communication device, a smart phone, a cellular phone, a laptop computer, a computer, a tablet, a personal digital assistant, a display device, a television, a gaming console, a music player, a radio, a digital video player, a digital video disc (DVD) player, a tuner, a camera, a navigation device, a vehicle, a component of a vehicle, or any combination thereof, as illustrative, non-limiting examples.

In an illustrative implementation, the memory 853 may include or correspond to a non-transitory computer readable medium storing the instructions 860. The instructions 860 may include one or more instructions that are executable by a computer, such as the processors 810, 806 or the CODEC 834. The instructions 860 may cause the processor 810 to perform one or more operations described herein, including but not limited to one or more portions of the method 700 of FIG. 7.

In a particular implementation, one or more components of the systems and devices disclosed herein may be integrated into a decoding system or apparatus (e.g., an electronic device, a CODEC, or a processor therein), into an encoding system or apparatus, or both. In other implementations, one or more components of the systems and devices disclosed herein may be integrated into a wireless telephone, a tablet computer, a desktop computer, a laptop computer, a set top box, a music player, a video player, an entertainment unit, a television, a game console, a navigation device, a communication device, a personal digital assistant (PDA), a fixed location data unit, a personal media player, or another type of device.

In conjunction with the described techniques, an apparatus includes means for storing noise data corresponding to microphones in a microphone array, such as the memory 140. The apparatus also includes means for performing signal processing operations on signals captured by microphones in the microphone array to generate multiple sets of ambisonic signals, such as the ambisonics conversion circuit 110. The multiple sets of ambisonic signals include a first set corresponding to a first particular ambisonic order and a second set corresponding to a second particular ambisonic order.

The apparatus also includes means for performing a first noise reduction operation that includes applying a first gain factor to each ambisonic signal in the first set, the first gain factor based on the noise data, such as the frequency-domain vector-type noise subtraction circuit 124, 125, 126, or 127, one or more of the components 300 of FIG. 3, or a combination thereof. The apparatus further includes means for performing a second noise reduction operation that includes applying a second gain factor to each ambisonic signal in the second set, the second gain factor based on the noise data and distinct from the first gain factor, such as the frequency-domain vector-type noise subtraction circuit 124, 125, 126, or 127, one or more of the components 300 of FIG. 3, or a combination thereof.

The foregoing techniques may be performed with respect to any number of different contexts and audio ecosystems. A number of example contexts are described below, although the techniques should be limited to the example contexts. One example audio ecosystem may include audio content, movie studios, music studios, gaming audio studios, channel based audio content, coding engines, game audio stems, game audio coding/rendering engines, and delivery systems.

The movie studios, the music studios, and the gaming audio studios may receive audio content. In some examples, the audio content may represent the output of an acquisition. The movie studios may output channel based audio content (e.g., in 2.0, 5.1, and 7.1) such as by using a digital audio workstation (DAW). The music studios may output channel based audio content (e.g., in 2.0, and 5.1) such as by using a DAW. In either case, the coding engines may receive and encode the channel based audio content based one or more codecs (e.g., AAC, AC3, Dolby True HD, Dolby Digital Plus, and DTS Master Audio) for output by the delivery systems. The gaming audio studios may output one or more game audio stems, such as by using a DAW. The game audio coding/rendering engines may code and or render the audio stems into channel based audio content for output by the delivery systems. Another example context in which the techniques may be performed includes an audio ecosystem that may include broadcast recording audio objects, professional audio systems, consumer on-device capture, HOA audio format, on-device rendering, consumer audio, TV, and accessories, and car audio systems.

The broadcast recording audio objects, the professional audio systems, and the consumer on-device capture may all code their output using HOA audio format. In this way, the audio content may be coded using the HOA audio format into a single representation that may be played back using the on-device rendering, the consumer audio, TV, and accessories, and the car audio systems. In other words, the single representation of the audio content may be played back at a generic audio playback system (i.e., as opposed to requiring a particular configuration such as 5.1, 7.1, etc.).

Other examples of context in which the techniques may be performed include an audio ecosystem that may include acquisition elements, and playback elements. The acquisition elements may include wired and/or wireless acquisition devices (e.g., Eigen microphones), on-device surround sound capture, and mobile devices (e.g., smartphones and tablets). In some examples, wired and/or wireless acquisition devices may be coupled to mobile device via wired and/or wireless communication channel(s).

In accordance with one or more techniques of this disclosure, the mobile device may be used to acquire a soundfield. For instance, the mobile device may acquire a soundfield via the wired and/or wireless acquisition devices and/or the on-device surround sound capture (e.g., a plurality of microphones integrated into the mobile device). The mobile device may then code the acquired soundfield into the HOA coefficients for playback by one or more of the playback elements. For instance, a user of the mobile device may record (acquire a soundfield of) a live event (e.g., a meeting, a conference, a play, a concert, etc.), and code the recording into HOA coefficients.

The mobile device may also utilize one or more of the playback elements to playback the HOA coded soundfield. For instance, the mobile device may decode the HOA coded soundfield and output a signal to one or more of the playback elements that causes the one or more of the playback elements to recreate the soundfield. As one example, the mobile device may utilize the wireless and/or wireless communication channels to output the signal to one or more speakers (e.g., speaker arrays, sound bars, etc.). As another example, the mobile device may utilize docking solutions to output the signal to one or more docking stations and/or one or more docked speakers (e.g., sound systems in smart cars and/or homes). As another example, the mobile device may utilize headphone rendering to output the signal to a set of headphones, e.g., to create realistic binaural sound.

In some examples, a particular mobile device may both acquire a 3D soundfield and playback the same 3D soundfield at a later time. In some examples, the mobile device may acquire a 3D soundfield, encode the 3D soundfield into HOA, and transmit the encoded 3D soundfield to one or more other devices (e.g., other mobile devices and/or other non-mobile devices) for playback.

Yet another context in which the techniques may be performed includes an audio ecosystem that may include audio content, game studios, coded audio content, rendering engines, and delivery systems. In some examples, the game studios may include one or more DAWs which may support editing of HOA signals. For instance, the one or more DAWs may include HOA plugins and/or tools which may be configured to operate with (e.g., work with) one or more game audio systems. In some examples, the game studios may output new stem formats that support HOA. In any case, the game studios may output coded audio content to the rendering engines which may render a soundfield for playback by the delivery systems.

The techniques may also be performed with respect to exemplary audio acquisition devices. For example, the techniques may be performed with respect to an Eigen microphone which may include a plurality of microphones that are collectively configured to record a 3D soundfield. In some examples, the plurality of microphones of Eigen microphone may be located on the surface of a substantially spherical ball with a radius of approximately 4 cm.

Another exemplary audio acquisition context may include a production truck which may be configured to receive a signal from one or more microphones, such as one or more Eigen microphones. The production truck may also include an audio encoder.

The mobile device may also, in some instances, include a plurality of microphones that are collectively configured to record a 3D soundfield. In other words, the plurality of microphone may have X, Y, Z diversity. In some examples, the mobile device may include a microphone which may be rotated to provide X, Y, Z diversity with respect to one or more other microphones of the mobile device. The mobile device may also include an audio encoder.

Example audio playback devices that may perform various aspects of the techniques described in this disclosure are further discussed below. In accordance with one or more techniques of this disclosure, speakers and/or sound bars may be arranged in any arbitrary configuration while still playing back a 3D soundfield. Moreover, in some examples, headphone playback devices may be coupled to a decoder via either a wired or a wireless connection. In accordance with one or more techniques of this disclosure, a single generic representation of a soundfield may be utilized to render the soundfield on any combination of the speakers, the sound bars, and the headphone playback devices.

A number of different example audio playback environments may also be suitable for performing various aspects of the techniques described in this disclosure. For instance, a 5.1 speaker playback environment, a 2.0 (e.g., stereo) speaker playback environment, a 9.1 speaker playback environment with full height front loudspeakers, a 22.2 speaker playback environment, a 16.0 speaker playback environment, an automotive speaker playback environment, and a mobile device with ear bud playback environment may be suitable environments for performing various aspects of the techniques described in this disclosure.

In accordance with one or more techniques of this disclosure, a single generic representation of a soundfield may be utilized to render the soundfield on any of the foregoing playback environments. Additionally, the techniques of this disclosure enable a rendered to render a soundfield from a generic representation for playback on the playback environments other than that described above. For instance, if design considerations prohibit proper placement of speakers according to a 7.1 speaker playback environment (e.g., if it is not possible to place a right surround speaker), the techniques of this disclosure enable a render to compensate with the other 6 speakers such that playback may be achieved on a 6.1 speaker playback environment.

Moreover, a user may watch a sports game while wearing headphones. In accordance with one or more techniques of this disclosure, the 3D soundfield of the sports game may be acquired (e.g., one or more Eigen microphones may be placed in and/or around the baseball stadium), HOA coefficients corresponding to the 3D soundfield may be obtained and transmitted to a decoder, the decoder may reconstruct the 3D soundfield based on the HOA coefficients and output the reconstructed 3D soundfield to a renderer, the renderer may obtain an indication as to the type of playback environment (e.g., headphones), and render the reconstructed 3D soundfield into signals that cause the headphones to output a representation of the 3D soundfield of the sports game.

It should be noted that various functions performed by the one or more components of the systems and devices disclosed herein are described as being performed by certain components. This division of components is for illustration only. In an alternate implementation, a function performed by a particular component may be divided amongst multiple components. Moreover, in an alternate implementation, two or more components may be integrated into a single component or module. Each component may be implemented using hardware (e.g., a field-programmable gate array (FPGA) device, an application-specific integrated circuit (ASIC), a DSP, a controller, etc.), software (e.g., instructions executable by a processor), or any combination thereof.

Those of skill would further appreciate that the various illustrative logical blocks, configurations, circuits, and algorithm steps described in connection with the implementations disclosed herein may be implemented as electronic hardware, computer software executed by a processing device such as a hardware processor, or combinations of both. Various illustrative components, blocks, configurations, circuits, and steps have been described above generally in terms of their functionality. Whether such functionality is implemented as hardware or executable software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the implementations disclosed herein may be embodied directly in hardware, in a software module executed by a processor, or in a combination of the two. A software module may reside in a memory device, such as random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, or a compact disc read-only memory (CD-ROM). An exemplary memory device is coupled to the processor such that the processor can read information from, and write information to, the memory device. In the alternative, the memory device may be integral to the processor. The processor and the storage medium may reside in an application-specific integrated circuit (ASIC). The ASIC may reside in a computing device or a user terminal. In the alternative, the processor and the storage medium may reside as discrete components in a computing device or a user terminal.

The previous description of the disclosed implementations is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A device to apply noise reduction to ambisonic signals, the device comprising:

a memory configured to store noise data corresponding to microphones in a microphone array; and a processor configured to:

perform signal processing operations on signals captured by the microphones in the microphone array to generate multiple sets of ambisonic signals, the multiple sets of ambisonic signals including a first set corresponding to a first particular ambisonic order and a second set corresponding to a second particular ambisonic order;

perform a first noise reduction operation that includes applying a first gain factor to each ambisonic signal in the first set, the first gain factor based on the noise data; and perform a second noise reduction operation that includes applying a second gain factor to each ambisonic signal in the second set, the second gain factor based on the noise data and distinct from the first gain factor.

2. The device of claim 1, wherein the noise data includes first frequency-based noise data corresponding to the first particular ambisonic order and second frequency-based noise data corresponding to the second particular ambisonic order, wherein the first gain factor is determined based on the first frequency-based noise data, and wherein the second gain factor is determined based on the second frequency-based noise data.

3. The device of claim 2, wherein the processor is further configured to determine the first frequency-based noise data by:

determining, for each channel that is associated with the first particular ambisonic order, a signal power of the channel;

generating a first sum of the signal powers of the channels that are associated with the first particular ambisonic order;

determining, based on the first sum, a first noise power associated with the first particular ambisonic order;

determining, for each channel that is associated with the second particular ambisonic order, a signal power of the channel;

generating a second sum of the signal powers of the channels that are associated with the second particular ambisonic order; and determining, based on the second sum, a second noise power associated with the second particular ambisonic order.

4. The device of claim 3, wherein the first particular ambisonic order corresponds to a third order, and wherein the channels associated with the first particular ambisonic order are third order ambisonic channels.

5. The device of claim 2, wherein the first frequency-based noise data indicates a first noise power at a particular frequency and the second frequency-based noise data indicates a second noise power at the particular frequency, and wherein the processor is further configured to perform the first noise reduction operation by:

determining a first total power based on a sum of a power of each ambisonic signal in the first set;

determining the first gain factor based on the first noise power and the first total power; and scaling samples of each ambisonic signal in the first set.

6. The device of claim 5, wherein the first gain factor is determined based on a difference of the first total power and the first noise power as compared to the first total power.

7. The device of claim 5, wherein determining the first gain factor further includes multiplying a previous gain factor and a smoothing parameter, the previous gain factor based on previous frequency samples of each ambisonic signal in the first set at the particular frequency.

8. The device of claim 5, wherein scaling the samples of each ambisonic signal in the first set based on the first gain factor reduces noise without distorting directional information of the first set.

9. The device of claim 1, wherein the processor is further configured to receive, via a user interface, a user input corresponding to a parameter of at least one of the first noise reduction operation or the second noise reduction operation.

10. The device of claim 9, wherein the parameter includes at least one of a smoothing parameter or an aggressiveness parameter, and wherein the user input indicates a single value of the parameter for multiple ambisonic orders or individual values of the parameter for the multiple ambisonic orders.

11. The device of claim 9, wherein the user input indicates a playback system, and wherein the parameter is selected based on the playback system.

12. The device of claim 9, further comprising a display device, and wherein the processor is further configured to generate the user interface for display at the display device.

13. The device of claim 1, further comprising a wearable optical device, wherein the microphone array is integrated into the wearable optical device.

14. The device of claim 1, further comprising a laptop, wherein the microphone array is integrated into the laptop.

15. The device of claim 1, further comprising a camera, wherein the microphone array is integrated into the camera.

16. The device of claim 1, further comprising an augmented reality headset, wherein the microphone array is integrated into the augmented reality headset.

17. The device of claim 1, wherein the processor is within the microphone array.

18. A method of reducing noise in ambisonic signals, the method comprising:

performing signal processing operations on signals captured by microphones in a microphone array to generate ambisonic signals, the ambisonic signals including multiple sets of ambisonic signals including a first set corresponding to a first particular ambisonic order and a second set corresponding to a second particular ambisonic order;

performing a first noise reduction operation that includes applying a first gain factor to each ambisonic signal in the first set, the first gain factor based on noise data corresponding to the microphones; and performing a second noise reduction operation that includes applying a second gain factor to each ambisonic signal in the second set, the second gain factor based on the noise data and distinct from the first gain factor.

19. The method of claim 18, wherein the noise data includes first frequency-based noise data of the first set of ambisonic signals corresponding to the first particular ambisonic order and second frequency-based noise data of the second set of ambisonic signals corresponding to the second particular ambisonic order, wherein the first gain factor is determined based on the first frequency-based noise data, and wherein the second gain factor is determined based on the second frequency-based noise data.

20. The method of claim 19, further comprising determining the first frequency-based noise data by:

determining, for each channel that is associated with the first particular ambisonic order, a signal power of the channel;

generating a first sum of the signal powers of the channels that are associated with the first particular ambisonic order;

determining, based on the first sum, a first noise power associated with the first particular ambisonic order;

determining, for each channel that is associated with the second particular ambisonic order, a signal power of the channel;

generating a second sum of the signal powers of the channels that are associated with the second particular ambisonic order; and determining, based on the second sum, a second noise power associated with the second particular ambisonic order.

21. The method of claim 20, wherein the first particular ambisonic order corresponds to a third order, and wherein the channels associated with the first particular ambisonic order are third order ambisonic channels.

22. The method of claim 19, wherein the first frequency-based noise data indicates a first noise power at a particular frequency and the second frequency-based noise data indicates a second noise power at the particular frequency, and wherein performing the first noise reduction operation includes:

determining a first total power based on a sum of a power of each ambisonic signal in the first set;

determining the first gain factor based on the first noise power and the first total power; and scaling samples of each ambisonic signal in the first set.

23. The method of claim 22, wherein the first gain factor is determined based on a difference of the first total power and the first noise power as compared to the first total power.

24. The method of claim 22, wherein scaling the samples of each ambisonic signal in the first set based on the first gain factor reduces noise without distorting directional information of the first set.

25. A non-transitory computer-readable medium comprising instructions that, when executed by a processor, cause the processor to perform operations to apply noise reduction to ambisonic signals, the operations comprising:

performing signal processing operations on signals captured by microphones in a microphone array to generate ambisonic signals, the ambisonic signals including multiple sets of ambisonic signals including a first set corresponding to a first particular ambisonic order and a second set corresponding to a second particular ambisonic order;

performing a first noise reduction operation that includes applying a first gain factor to each ambisonic signal in the first set, the first gain factor based on noise data corresponding to the microphones; and performing a second noise reduction operation that includes applying a second gain factor to each ambisonic signal in the second set, the second gain factor based on the noise data and distinct from the first gain factor.

26. An apparatus to apply noise reduction to ambisonic signals, the apparatus comprising:

means for storing noise data corresponding to microphones in a microphone array;

means for performing signal processing operations on signals captured by microphones in the microphone array to generate multiple sets of ambisonic signals, the multiple sets of ambisonic signals including a first set corresponding to a first particular ambisonic order and a second set corresponding to a second particular ambisonic order;

means for performing a first noise reduction operation that includes applying a first gain factor to each ambisonic signal in the first set, the first gain factor based on the noise data; and means for performing a second noise reduction operation that includes applying a second gain factor to each ambisonic signal in the second set, the second gain factor based on the noise data and distinct from the first gain factor.

* * * * *